US009479718B2

(12) United States Patent
Ichikawa et al.

(10) Patent No.: US 9,479,718 B2
(45) Date of Patent: Oct. 25, 2016

(54) SIGNAL PROCESSING APPARATUS, SIGNAL PROCESSING METHOD, IMAGE PICKUP ELEMENT, AND IMAGING APPARATUS

(71) Applicant: Sony Corporation, Tokyo (JP)

(72) Inventors: Tatsuya Ichikawa, Kanagawa (JP); Nobutaka Shimamura, Kanagawa (JP); Atsushi Suzuki, Kanagawa (JP); Yusuke Oike, Kanagawa (JP); Katsumi Honda, Kanagawa (JP); Masahiro Nakamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 9 days.

(21) Appl. No.: 14/615,197

(22) Filed: Feb. 5, 2015

(65) Prior Publication Data

US 2015/0229857 A1    Aug. 13, 2015

(30) Foreign Application Priority Data

Feb. 13, 2014 (JP) ................................. 2014-025077
Jul. 8, 2014 (JP) ................................. 2014-140389

(51) Int. Cl.
| | | |
|---|---|---|
| H04N 5/357 | (2011.01) | |
| H04N 5/369 | (2011.01) | |
| H04N 5/363 | (2011.01) | |
| H04N 5/374 | (2011.01) | |
| H04N 5/378 | (2011.01) | |
| H03M 3/00 | (2006.01) | |

(52) U.S. Cl.
CPC ............. *H04N 5/363* (2013.01); *H03M 3/342* (2013.01); *H04N 5/3575* (2013.01); *H04N 5/374* (2013.01); *H04N 5/378* (2013.01)

(58) Field of Classification Search
None
See application file for complete search history.

(56) References Cited

U.S. PATENT DOCUMENTS

| 8,330,635 | B2* | 12/2012 | Hisamatsu | ............. | H03K 23/62 341/118 |
| 2008/0079444 | A1* | 4/2008 | Denison | ................... | G01D 5/24 324/679 |
| 2008/0129570 | A1* | 6/2008 | Lim | ..................... | H03M 1/1245 341/155 |

FOREIGN PATENT DOCUMENTS

JP             2013-030820 A         2/2013

\* cited by examiner

*Primary Examiner* — Mark T Monk
*Assistant Examiner* — Mark Monk
(74) *Attorney, Agent, or Firm* — Sheridan Ross P.C.

(57) ABSTRACT

Provided is a signal processing apparatus, including: an A/D conversion unit configured to perform A/D conversion of a first signal, A/D conversion of a second signal, A/D conversion of a third signal, and A/D conversion of a fourth signal; and a correlated double sampling processing unit configured to generate a first output signal by performing correlated double sampling using a first digital data item obtained through the A/D conversion of the first signal, and a second digital data item obtained through the A/D conversion of the second signal, a second output signal by performing correlated double sampling using a third digital data item obtained through the A/D conversion of the third signal, and a fourth digital data item obtained through the A/D conversion of the fourth signal, and a third output signal by performing correlated double sampling using the first output signal and the second output signal.

10 Claims, 11 Drawing Sheets

| G/R/B | G/R/B | G/R/B | G/R/B | G/R/B | G/R/B | G/R/B | G/R/B |
|---|---|---|---|---|---|---|---|
| G/R/B | G/R/B | G/R/B | G/R/B | G/R/B | G/R/B | G/R/B | G/R/B |
| G/R/B | G/R/B | G/R/B | G/R/B | G/R/B | G/R/B | G/R/B | G/R/B |
| G/R/B | G/R/B | G/R/B | G/R/B | G/R/B | G/R/B | G/R/B | G/R/B |
| G/R/B | G/R/B | G/R/B | G/R/B | G/R/B | G/R/B | G/R/B | G/R/B |
| G/R/B | G/R/B | G/R/B | G/R/B | G/R/B | G/R/B | G/R/B | G/R/B |
| G/R/B | G/R/B | G/R/B | G/R/B | G/R/B | G/R/B | G/R/B | G/R/B |
| G/R/B | G/R/B | G/R/B | G/R/B | G/R/B | G/R/B | G/R/B | G/R/B |

FIG.3

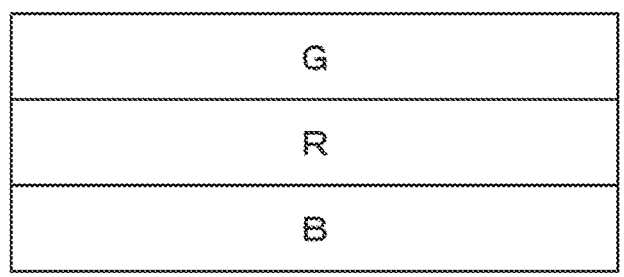

FIG.4

SIGNAL PROCESSING APPARATUS, SIGNAL PROCESSING METHOD, IMAGE PICKUP ELEMENT, AND IMAGING APPARATUS

CROSS REFERENCE TO RELATED APPLICATIONS

This application claims the benefit of Japanese Priority Patent Application JP 2014-025077 filed Feb. 13, 2014, and Japanese Priority Patent Application JP 2014-140389 filed Jul. 8, 2014, the entire contents of each of which are incorporated herein by reference.

BACKGROUND

The present technology relates to a signal processing apparatus, a signal processing method, an image pickup element, and an imaging apparatus. More particularly, the present technology relates to a signal processing apparatus, a signal processing method, an image pickup element, and an imaging apparatus that are capable of suppressing deterioration in image quality.

In recent years, in imaging apparatuses such as a camcorder and a digital still camera, image sensors (image pickup elements) using CCDs (Charge Coupled Devices) or CMOSs (Complementary Metal Oxide Semiconductors) have been used as image pickup elements for capturing images.

In such image pickup elements, at parts in which electric charge is converted to voltage, reset noise to be generated, for example, by thermal fluctuation of the electric charge, that is, kTC noise is generated. In view of the circumstances, various methods of suppressing the kTC noise have been devised (refer, for example, to Japanese Patent Application Laid-open No. 2013-30820).

SUMMARY

However, by the method described in Japanese Patent Application Laid-open No. 2013-30820, the kTC noise is difficult to sufficiently suppress, and residual parts of the kTC noise may adversely affect RN noise of the image pickup element. As a result, captured images to be obtained by the image pickup element may be deteriorated in image quality.

In particular, in a case where full depletion is not performed in a pixel structure of the image pickup element, the kTC noise becomes larger, and the kTC noise is more difficult to sufficiently suppress. As a result, captured images to be obtained by the image pickup element may be further deteriorated in image quality.

There is a need to suppress deterioration in image quality.

According to an embodiment of the present technology, there is provided a signal processing apparatus, including:
an A/D conversion unit configured to perform
A/D conversion of a first signal that is read out from unit pixels under a state in which reset signals of the unit pixels have been set to be high by a shutter operation of resetting floating diffusions of the unit pixels, the unit pixels being configured to perform photoelectric conversion of incident light under a state in which full depletion is prevented,
A/D conversion of a second signal that is read out from the unit pixels under a state in which the reset signals of the unit pixels have been set to be low by the shutter operation,
A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion, and
A/D conversion of a fourth signal that is read out from the unit pixels under a state in which the reset signals of the unit pixels have been set to be high by the read operation; and
a correlated double sampling processing unit configured to generate
a first output signal by performing correlated double sampling using
a first digital data item obtained through the A/D conversion of the first signal by the A/D conversion unit, and
a second digital data item obtained through the A/D conversion of the second signal by the A/D conversion unit,
a second output signal by performing correlated double sampling using
a third digital data item obtained through the A/D conversion of the third signal by the A/D conversion unit, and
a fourth digital data item obtained through the A/D conversion of the fourth signal by the A/D conversion unit, and
a third output signal by performing correlated double sampling using
the first output signal, and
the second output signal.

The signal processing apparatus according to the embodiment of the present technology may further include a storage unit configured to store the first digital data item, the second digital data item, the third digital data item, and the fourth digital data item that are obtained by the A/D conversion unit.

The correlated double sampling processing unit may be configured to perform correlated double sampling by using one of a pair of the first digital data item and the second digital data item that are read out from the storage unit and a pair of the third digital data item and the fourth digital data item that are read out from the storage unit.

The storage unit may be configured to further store the first output signal that is generated by the correlated double sampling processing unit, and
the correlated double sampling processing unit may be configured to perform correlated double sampling by using the second output signal that is generated by the correlated double sampling processing unit and the first output signal that is read out from the storage unit.

The signal processing apparatus according the embodiment of the present technology may further include a clamp control unit configured to clamp a reference signal having a ramp waveform such that, in the A/D conversion unit,
the A/D conversion of the first signal that is read out from the unit pixels under the state in which the reset signals of the unit pixels have been set to be high by the shutter operation is properly performed through comparison between the first signal and the reference signal having the ramp waveform, and that
the A/D conversion of the fourth signal that is read out from the unit pixels under the state in which the reset signals of the unit pixels have been set to be high by the read operation is properly performed through comparison between the fourth signal and the reference signal having the ramp waveform.

According to the embodiment of the present technology, there is also provided a signal processing method, including:

performing A/D conversion of a first signal that is read out from unit pixels under a state in which reset signals of the unit pixels have been set to be high by a shutter operation of resetting floating diffusions of the unit pixels, the unit pixels being configured to perform photoelectric conversion of incident light under a state in which full depletion is prevented;

performing A/D conversion of a second signal that is read out from the unit pixels under a state in which the reset signals of the unit pixels have been set to be low by the shutter operation;

generating a first output signal by performing correlated double sampling using
 a first digital data item obtained through the A/D conversion of the first signal, and
 a second digital data item obtained through the A/D conversion of the second signal;

performing A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion;

performing A/D conversion of a fourth signal that is read out from the unit pixels under a state in which the reset signals of the unit pixels have been set to be high by the read operation;

generating a second output signal by performing correlated double sampling using
 a third digital data item obtained through the A/D conversion of the third signal, and
 a fourth digital data item obtained through the A/D conversion of the fourth signal; and generating a third output signal by performing correlated double sampling using
 the first output signal, and
 the second output signal.

According to another embodiment of the present technology, there is provided an image pickup element, including:

unit pixels configured to perform photoelectric conversion of incident light under a state in which full depletion is prevented;

an A/D conversion unit configured to perform
 A/D conversion of a first signal that is read out from the unit pixels under a state in which reset signals of the unit pixels have been set to be high by a shutter operation of resetting floating diffusions of the unit pixels,
 A/D conversion of a second signal that is read out from the unit pixels under a state in which the reset signals of the unit pixels have been set to be low by the shutter operation,
 A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion, and
 A/D conversion of a fourth signal that is read out from the unit pixels under a state in which the reset signals of the unit pixels have been set to be high by the read operation; and a correlated double sampling processing unit configured to generate
 a first output signal by performing correlated double sampling using
  a first digital data item obtained through the A/D conversion of the first signal by the A/D conversion unit, and
  a second digital data item obtained through the A/D conversion of the second signal by the A/D conversion unit,
 a second output signal by performing correlated double sampling using
  a third digital data item obtained through the A/D conversion of the third signal by the A/D conversion unit, and
  a fourth digital data item obtained through the A/D conversion of the fourth signal by the A/D conversion unit, and
 a third output signal by performing correlated double sampling using
  the first output signal, and
  the second output signal.

The unit pixels may each include a photoelectric conversion unit that performs the photoelectric conversion of the incident light and is connected to corresponding one of the floating diffusions by wire bonding.

The unit pixels may each include a pixel structure that performs color separation in a vertical direction with respect to a substrate.

The unit pixels may each perform
 color separation into green by using an organic photoelectric conversion film, and
 color separation into red and blue respectively in accordance with silicon depths.

The unit pixels may each perform color separation into green, red, and blue respectively in accordance with silicon depths.

According to still another embodiment of the present technology, there is provided an imaging apparatus, including:

an imaging unit configured to image a photographic subject; and an image processing unit configured to execute image processes on captured image data obtained by the imaging unit, the imaging unit including
 unit pixels configured to perform photoelectric conversion of incident light under a state in which full depletion is prevented,
 an A/D conversion unit configured to perform
  A/D conversion of a first signal that is read out from the unit pixels under a state in which reset signals of the unit pixels have been set to be high by a shutter operation of resetting floating diffusions of the unit pixels,
  A/D conversion of a second signal that is read out from the unit pixels under a state in which the reset signals of the unit pixels have been set to be low by the shutter operation,
  A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion, and A/D conversion of a fourth signal that is read out from the unit pixels under a state in which the reset signals of the unit pixels have been set to be high by the read operation, and a correlated double sampling processing unit configured to generate a first output signal by performing correlated double sampling using a first digital data item obtained through the A/D conversion of the first signal by the A/D conversion unit, and a second digital data item obtained through the A/D conversion of the second signal by the A/D conversion unit, a second output signal by performing correlated double sampling using a third digital data item obtained through the A/D conversion of the third signal by the A/D conversion unit, and a fourth digital data item obtained through the A/D conversion of the fourth signal by the A/D conversion unit, and a third output signal by performing correlated double sampling using the first output signal, and the second output signal.

According to the embodiment of the present technology, there are performed

A/D conversion of the first signal that is read out from the unit pixels under the state in which the reset signals of the unit pixels have been set to be high by the shutter operation of resetting the floating diffusions of the unit pixels, the unit pixels being configured to perform the photoelectric conversion of the incident light under the state in which the full depletion is prevented, A/D conversion of the second signal that is read out from the unit pixels under the state in which the reset signals of the unit pixels have been set to be low by the shutter operation, generation of the first output signal by performing the correlated double sampling using the first digital data item obtained through the A/D conversion of the first signal, and the second digital data item obtained through the A/D conversion of the second signal, A/D conversion of the third signal that is read out from the unit pixels under the state in which the reset signals of the unit pixels have been set to be low by the read operation of reading out the electric charge from the floating diffusions of the unit pixels, the electric charge being obtained through the photoelectric conversion, A/D conversion of the fourth signal that is read out from the unit pixels under the state in which the reset signals of the unit pixels have been set to be high by the read operation, generation of the second output signal by performing the correlated double sampling using the third digital data item obtained through the A/D conversion of the third signal, and the fourth digital data item obtained through the A/D conversion of the fourth signal, and generation of the third output signal by performing the correlated double sampling using the first output signal, and the second output signal.

According to the other embodiment of the present technology, there are performed photoelectric conversion of the incident light in the unit pixels under the state in which the full depletion is prevented, A/D conversion of the first signal that is read out from the unit pixels under the state in which the reset signals of the unit pixels have been set to be high by the shutter operation of resetting the floating diffusions of the unit pixels, A/D conversion of the second signal that is read out from the unit pixels under the state in which the reset signals of the unit pixels have been set to be low by the shutter operation, generation of the first output signal by performing the correlated double sampling using the first digital data item obtained through the A/D conversion of the first signal, and the second digital data item obtained through the A/D conversion of the second signal, A/D conversion of the third signal that is read out from the unit pixels under the state in which the reset signals of the unit pixels have been set to be low by the read operation of reading out the electric charge from the floating diffusions of the unit pixels, the electric charge being obtained through the photoelectric conversion, A/D conversion of the fourth signal that is read out from the unit pixels under the state in which the reset signals of the unit pixels have been set to be high by the read operation, generation of the second output signal by performing the correlated double sampling using the third digital data item obtained through the A/D conversion of the third signal, and the fourth digital data item obtained through the A/D conversion of the fourth signal, and generation of the third output signal by performing the correlated double sampling using the first output signal, and the second output signal.

According to the still other embodiment of the present technology, there are performed imaging of the photographic subject, photoelectric conversion of the incident light in the unit pixels under the state in which the full depletion is prevented, A/D conversion of the first signal that is read out from the unit pixels under the state in which the reset signals of the unit pixels have been set to be high by the shutter operation of resetting the floating diffusions of the unit pixels, A/D conversion of the second signal that is read out from the unit pixels under the state in which the reset signals of the unit pixels have been set to be low by the shutter operation, generation of the first output signal by performing the correlated double sampling using the first digital data item obtained through the A/D conversion of the first signal, and the second digital data item obtained through the A/D conversion of the second signal, A/D conversion of the third signal that is read out from the unit pixels under the state in which the reset signals of the unit pixels have been set to be low by the read operation of reading out the electric charge from the floating diffusions of the unit pixels, the electric charge being obtained through the photoelectric conversion, A/D conversion of the fourth signal that is read out from the unit pixels under the state in which the reset signals of the unit pixels have been set to be high by the read operation, generation of the second output signal by performing the correlated double sampling using the third digital data item obtained through the A/D conversion of the third signal, and the fourth digital data item obtained through the A/D conversion of the fourth signal, generation of the third output signal by performing the correlated double sampling using the first output signal, and the second output signal, and execution of the image processes on the third output signal, to thereby execute the image processes on a captured image of the photographic subject.

According to the embodiments of the present technology, signals can be processed. In particular, deterioration in image quality can be suppressed.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 3 is a diagram of an example of a pixel array;

FIG. 4 is a diagram of an example of a pixel structure;

DETAILED DESCRIPTION OF EMBODIMENTS

Figure 1:
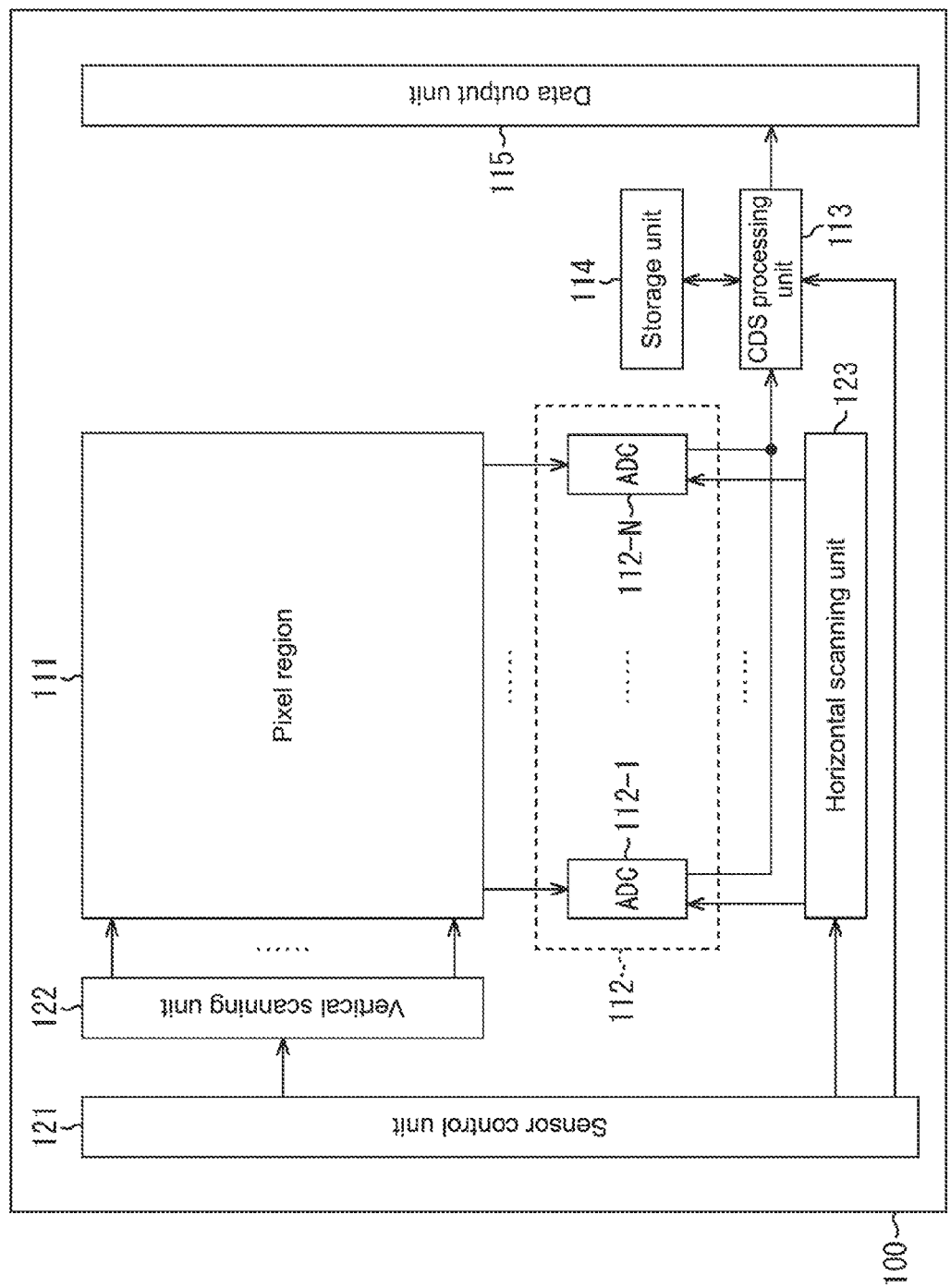
FIG. 1 is a diagram of a main configuration example of an image pickup element.

In the following, description is made of embodiments for carrying out the present disclosure (hereinafter, simply referred to as embodiments). Note that, the description is made in the following order.

1. First embodiment (signal processing apparatus, image pickup element, and imaging apparatus)
2. Second embodiment (image pickup element)
3. Third embodiment (image pickup element)
4. Fourth embodiment (image pickup element)
5. Fifth embodiment (imaging apparatus)

1. First Embodiment kTC Noise

In recent years, in imaging apparatus such as a camcorder and a digital still camera, image sensors (image pickup elements) using CCDs (Charge Coupled Devices) or CMOSs (Complementary Metal Oxide Semiconductors) have been used as image pickup elements for capturing images. Further, as those image pickup elements, there have been employed image pickup elements of a single plate type.

In the image pickup element of the single plate type, color filters each having a different color are respectively arranged in pixels (in general, RGB Bayer array has been widely used). For example, in a case where color filters in the Bayer array have primary colors, blue light and red light do not transmit onto pixels under green color filters. In this way, there is a problem that light is not efficiently used. Further, a process of generating color images by interpolating missing color information from adjacent pixels (demosaic process) needs to be executed. As a result, there is another problem that false colors are generated.

There is a need for an image pickup element that performs color separation in a vertical direction with respect to a substrate (depth direction). As a pixel structure of the image pickup element that performs the color separation in the vertical direction with respect to a substrate (depth direction), there has been known, for example, a pixel structure in which the color separation in the vertical direction with respect to a substrate is performed by using a silicon depth direction, a pixel structure in which the color separation in the vertical direction with respect to a substrate is performed by using a photoelectric conversion film, and a pixel structure in which the color separation in the vertical direction with respect to a substrate is performed by using both the silicon depth direction and the photoelectric conversion film.

In the imaging apparatus using the image pickup element that performs the color separation in the vertical direction with respect to a substrate (depth direction), color information items of a plurality of colors (normally, three colors of RGB) can be maintained in each pixel. With this, in comparison with the above-mentioned single plate type, light can be more efficiently used, and hence higher pixel characteristics can be expected. In addition, the demosaic process needs not be executed, and hence prevention of false-color generation can be expected.

However, in the pixel structure in which the color separation in the vertical direction with respect to a substrate is performed by using the photoelectric conversion film, the photoelectric conversion film and floating diffusions (FD) need to be connected to each other by wire bonding. Thus, there arises a risk that full depletion is not achieved. As a result, large kTC noise may be generated, and the kTC noise may not be removed.

Note that, by the method described in Japanese Patent Application Laid-open No. 2013-30820, large kTC noise can be suppressed to small kTC noise. However, the kTC noise is difficult to sufficiently suppress, and residual parts of the kTC noise may adversely affect RN noise of the image pickup element. As a result, captured images to be obtained by the image pickup element may be deteriorated in image quality.

(Countermeasure Against kTC Noise)

In view of the circumstances, there is provided a signal processing apparatus, including:

an A/D conversion unit configured to perform

A/D conversion of a first signal that is read out from unit pixels under a state in which reset signals of the unit pixels have been set to be high by a shutter operation of resetting floating diffusions of the unit pixels, the unit pixels being configured to perform photoelectric conversion of incident light under a state in which full depletion is prevented, A/D conversion of a second signal that is read out from the unit pixels under a state in which the reset signals of the unit pixels have been set to be low by the shutter operation, A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion, and A/D conversion of a fourth signal that is read out from the unit pixels under a state in which the reset signals of the unit pixels have been set to be high by the read operation; and a correlated double sampling processing unit configured to generate a first output signal by performing correlated double sampling using a first digital data item obtained through the A/D conversion of the first signal by the A/D conversion unit, and a second digital data item obtained through the A/D conversion of the second signal by the A/D conversion unit, a second output signal by performing correlated double sampling using a third digital data item obtained through the A/D conversion of the third signal by the A/D conversion unit, and a fourth digital data item obtained through the A/D conversion of the fourth signal by the A/D conversion unit, and a third output signal by performing correlated double sampling using the first output signal, and the second output signal.

In other words, there are performed

A/D conversion of the first signal that is read out from the unit pixels under the state in which the reset signals of the unit pixels have been set to be high by the shutter operation of resetting the floating diffusions of the unit pixels, the unit pixels being configured to perform the photoelectric conversion of the incident light under the state in which the full depletion is prevented, A/D conversion of the second signal that is read out from the unit pixels under the state in which the reset signals of the unit pixels have been set to be low by the shutter operation, generation of the first output signal by performing the correlated double sampling using the first digital data item obtained through the A/D conversion of the first signal, and the second digital data item obtained through the A/D conversion of the second signal, A/D conversion of the third signal that is read out from the unit pixels under the state in which the reset signals of the unit pixels have been set to be low by the read operation of reading out the electric charge from the floating diffusions of the unit pixels, the electric charge being obtained through the photoelectric conversion, A/D conversion of the fourth signal that is read out from the unit pixels under the state in which the reset signals of the unit pixels have been set to be high by the read operation, generation of the second output signal by performing the correlated double sampling using the third digital data item obtained through the A/D conversion of the third signal, and the fourth digital data item obtained through the A/D conversion of the fourth signal, and generation of the third output signal by performing the correlated double sampling using the first output signal, and the second output signal.

With this, the kTC noise included in pixel signals can be sufficiently suppressed. In this way, the signal processing apparatus is capable of suppressing deterioration in image quality of images corresponding to image data.

Note that, this signal processing apparatus may further include a storage unit configured to store the first digital data item, the second digital data item, the third digital data item, and the fourth digital data item that are obtained by the A/D conversion unit. The correlated double sampling processing unit may perform correlated double sampling by using one of a pair of the first digital data item and the second digital data item that are read out from the storage unit and a pair of the third digital data item and the fourth digital data item that are read out from the storage unit. This configuration enables the signal processing apparatus to adapt to intervals between timings of the shutter operations and the read operations. As a result, the correlated double sampling can be performed at more arbitrary timings.

Further, this storage unit may further store the first output signal that is generated by the correlated double sampling processing unit, and the correlated double sampling processing unit may perform correlated double sampling by using the second output signal that is generated by the correlated double sampling processing unit and the first output signal that is read out from the storage unit. As a result, this configuration enables the signal processing apparatus to perform the correlated double sampling at more arbitrary timings.

Note that, there may be provided an image pickup element, including:

unit pixels configured to perform photoelectric conversion of incident light under a state in which full depletion is prevented;

an A/D conversion unit configured to perform

A/D conversion of a first signal that is read out from the unit pixels under a state in which reset signals of the unit pixels have been set to be high by a shutter operation of resetting floating diffusions of the unit pixels, A/D conversion of a second signal that is read out from the unit pixels under a state in which the reset signals of the unit pixels have been set to be low by the shutter operation, A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion, and A/D conversion of a fourth signal that is read out from the unit pixels under a state in which the reset signals of the unit pixels have been set to be high by the read operation; and a correlated double sampling processing unit configured to generate a first output signal by performing correlated double sampling using a first digital data item obtained through the A/D conversion of the first signal by the A/D conversion unit, and a second digital data item obtained through the A/D conversion of the second signal by the A/D conversion unit,
a second output signal by performing correlated double sampling using
   a third digital data item obtained through the A/D conversion of the third signal by the A/D conversion unit, and
   a fourth digital data item obtained through the A/D conversion of the fourth signal by the A/D conversion unit, and
a third output signal by performing correlated double sampling using
   the first output signal, and
   the second output signal.

With this, the kTC noise included in the pixel signals can be sufficiently suppressed. In this way, the image pickup element is capable of suppressing deterioration in image quality of images corresponding to image data.

Further, the unit pixels may each include a photoelectric conversion unit that performs the photoelectric conversion of the incident light and is connected to corresponding one of the floating diffusions by wire bonding. In such a case, the kTC noise is difficult to sufficiently suppress. However, also in this case, by application of the present technology, the kTC noise included in the pixel signals can be sufficiently suppressed.

Still further, the unit pixels may each include a pixel structure that performs color separation in a vertical direction with respect to a substrate. In that case, color separation into green may be performed by using an organic photoelectric conversion film, and color separation into red and blue may be performed respectively in accordance with silicon depths. Alternatively, color separation into green, red, and blue may be performed respectively in accordance with silicon depths.

Note that, there may be provided an imaging apparatus, including:
an imaging unit configured to image a photographic subject; and
an image processing unit configured to execute image processes on captured image data obtained by the imaging unit, the imaging unit including
   unit pixels configured to perform photoelectric conversion of incident light under a state in which full depletion is prevented,
   an A/D conversion unit configured to perform
      A/D conversion of a first signal that is read out from the unit pixels under a state in which reset signals of the unit pixels have been set to be high by a shutter operation of resetting floating diffusions of the unit pixels,
      A/D conversion of a second signal that is read out from the unit pixels under a state in which the reset signals of the unit pixels have been set to be low by the shutter operation,
      A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion, and
      A/D conversion of a fourth signal that is read out from the unit pixels under a state in which the reset signals of the unit pixels have been set to be high by the read operation, and
   a correlated double sampling processing unit configured to generate
      a first output signal by performing correlated double sampling using
         a first digital data item obtained through the A/D conversion of the first signal by the A/D conversion unit, and
         a second digital data item obtained through the A/D conversion of the second signal by the A/D conversion unit,
      a second output signal by performing correlated double sampling using
         a third digital data item obtained through the A/D conversion of the third signal by the A/D conversion unit, and
         a fourth digital data item obtained through the A/D conversion of the fourth signal by the A/D conversion unit, and
      a third output signal by performing correlated double sampling using
         the first output signal, and
         the second output signal.

With this, the kTC noise included in the pixel signals can be sufficiently suppressed. In this way, the imaging apparatus is capable of suppressing deterioration in image quality of images corresponding to image data.

2. Second Embodiment

Image Pickup Element

FIG. 1 is a diagram of a main configuration example of an image pickup element to which the present technology is applied. An image pickup element 100 illustrated in FIG. 1 is an image sensor using, for example, CCDs (Charge Coupled Devices) or CMOSs (Complementary Metal Oxide Semiconductors), specifically, an element configured to image photographic subjects, perform photoelectric conversion and the like, and output captured images of the photographic subjects as image data (captured image data) to the outside.

As illustrated in FIG. 1, the image pickup element 100 includes a pixel region 111, an A/D conversion unit 112, a CDS (Correlated Double Sampling) processing unit 113, a storage unit 114, and a data output unit 115.

The pixel region 111 is a region in which pixels configured to receive light from the outside, perform photoelectric conversion, and output the light as electrical signals are provided. In the pixel region 111, a plurality of unit pixels each including a photoelectric conversion element are arranged in a predetermined pattern such as a matrix pattern (array pattern). The unit pixels to be arranged in the pixel region 111 are not particularly limited in number (in other words, pixel number) or arrangement pattern. For example, in a case where the unit pixels are arranged in the matrix pattern, rows and columns are not particularly limited in number as well. Detailed description of the configuration of the unit pixels is made below. The electrical signals read out from the unit pixels in the pixel region 111 are supplied to the A/D conversion unit 112.

The A/D conversion unit 112 is configured to perform A/D conversion of the signals (analog signals) read out from the unit pixels in the pixel region 111. The A/D conversion unit 112 includes a plurality of ADCs (Analog Digital Converters) (ADCs 112-1 to 112-N (N is an arbitrary natural number)).

The unit pixels in the pixel region 111 are grouped into different units to be assigned respectively to the ADCs 112-1 to 112-N. For example, in a case where the unit pixels are arranged in the matrix pattern in the pixel region 111, different columns of the unit pixels may be assigned respectively to the ADCs 112-1 to 112-N. Alternatively, different areas of the unit pixels may be assigned respectively to the ADCs 112-1 to 112-N.

The ADCs 112-1 to 112-N each perform the A/D conversion of the analog signal supplied from corresponding one of the groups of the unit pixels. For example, in a case where the unit pixels are arranged in N columns in the pixel region 111, and the different columns of the unit pixels are assigned respectively to the ADCs 112-1 to 112-N, the ADCs 112-1 to 112-N each perform A/D conversion of the signal supplied from the unit pixels in corresponding one of the columns. The A/D conversion unit 112 is capable of performing the A/D conversion of the signals supplied from all the unit pixels in the pixel region 111 (in other words, signals corresponding to one picture can be subjected to the A/D conversion).

The A/D conversion unit 112 (ADCs 112-1 to 112-N) is configured also to supply digital data items corresponding to the unit pixels, which are obtained through the A/D conversion, sequentially to the CDS processing unit 113.

The CDS (Correlated Double Sampling) processing unit 113 is configured to perform correlated double sampling (also referred to as CDS) by using the digital data items to be supplied. The CDS processing unit 113 uses the storage unit 114 at the time of performing the correlated double sampling (CDS) by using the plurality of digital data items supplied at different timings. Specifically, the CDS processing unit 113 stores the supplied digital data items into the storage unit 114, reads out the digital data items from the storage unit 114 at predetermined timings, and then performs the correlated double sampling (CDS). Further, for example, the CDS processing unit 113 may store processing results (output signals) of the correlated double sampling (CDS) into the storage unit 114, read out the processing results (output signals) of the correlated double sampling (CDS) from the storage unit 114 at predetermined timings, and then performs another correlated double sampling (CDS). In this way, new processing results (output signals) can be obtained.

The CDS processing unit 113 supplies the processing results of the correlated double sampling (CDS), which are obtained in this way, as the output signals to the data output unit 115.

The storage unit 114 includes arbitrary storage media such as a semiconductor memory, more specifically, a flash memory, a RAM (Random Access Memory), and an SSD (Solid State Drive), or a hard disk. The data items supplied from the CDS processing unit 113 are stored thereto. Further, in response to requests from the CDS processing unit 113, the storage unit 114 supplies the stored data items to the CDS processing unit 113.

The data output unit 115 includes an external terminal, and is configured to output the output signals supplied from the CDS processing unit 113 to the outside of the image pickup element 100. Note that, in that case, prior to the output, the data output unit 115 may encode the output signals according to a predetermined encoding method.

Further, the image pickup element 100 includes a sensor control unit 121, a vertical scanning unit 122, and a horizontal scanning unit 123.

The sensor control unit 121 is configured to control the units in the image pickup element 100, such as the vertical scanning unit 122, the horizontal scanning unit 123, and the CDS processing unit 113.

The vertical scanning unit 122 is configured to control operations of the unit pixels in the pixel region 111 under control by the sensor control unit 121. For example, the vertical scanning unit 122 controls readout of the signals from the unit pixels (such as pixel signals corresponding to electric charges that are obtained through photoelectric conversion of incident light and accumulated in the unit pixels).

The horizontal scanning unit 123 is configured to control operations of the ADCs 112-1 to 112-N (such as the A/D conversion and data transfer after the conversion) under the control by the sensor control unit 121.

In other words, the vertical scanning unit 122 and the horizontal scanning unit 123, which are controlled by the sensor control unit 121, perform control such that the signals are read out from the unit pixels in the pixel region 111 and subjected to the A/D conversion.

The CDS processing unit 113 is operated at the timings under the control by the sensor control unit 121. At those timings, the correlated double sampling is performed on the digital data items corresponding to the signals that are read out from the unit pixels and sequentially supplied from the A/D conversion unit 112 as described above.

(Configuration of Unit Pixel)

Figure 2:
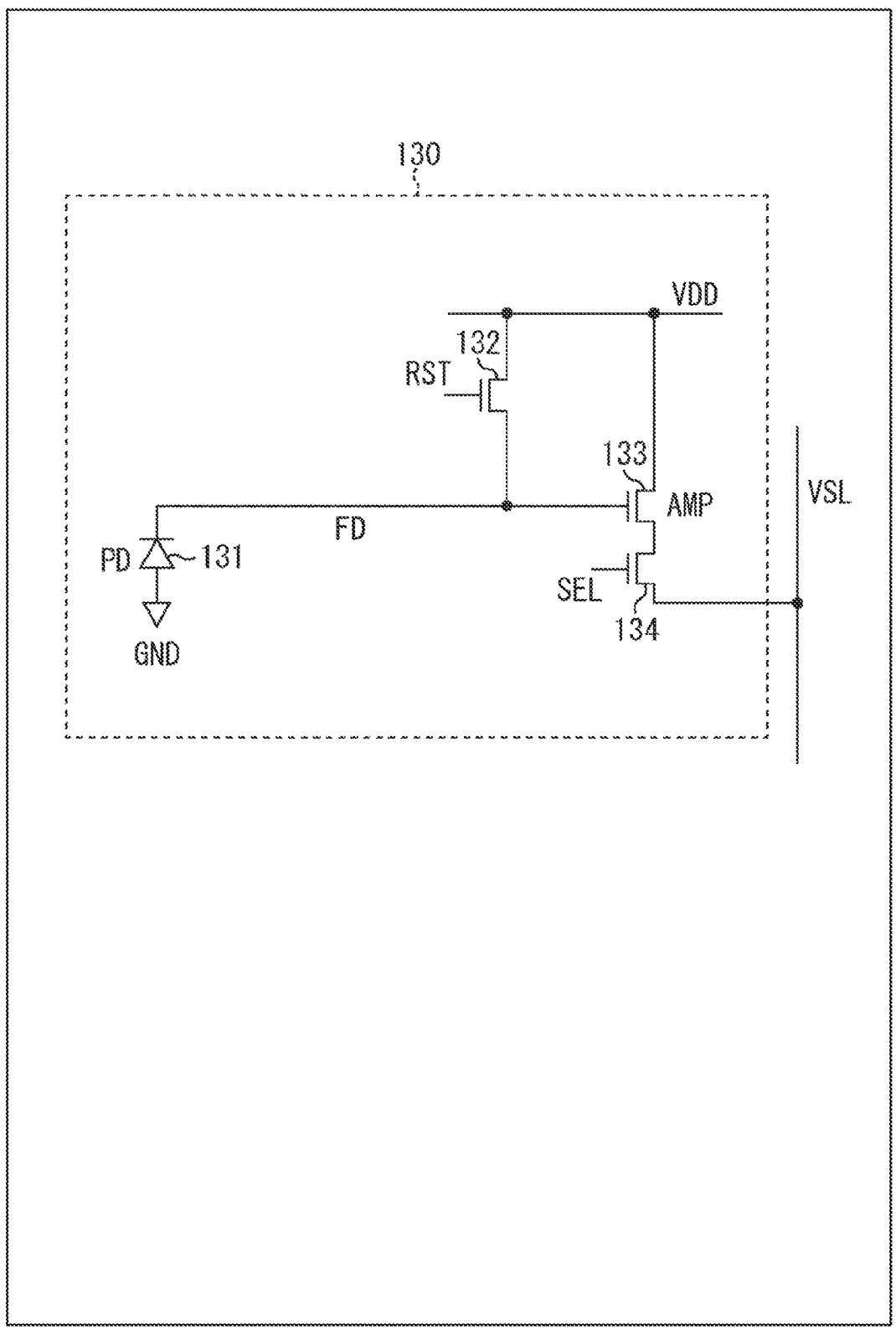
FIG. 2 is a diagram of a main configuration example of a unit pixel.

FIG. 2 is a diagram of a main configuration example of the unit pixel formed in the pixel region 111 of FIG. 1. As illustrated in FIG. 2, a unit pixel 130 includes a photodiode (PD) 131, a floating diffusion (FD), a reset transistor 132, an amplifying transistor 133, and a select transistor 134.

The photodiode (PD) 131 is configured to receive the light that has entered the unit pixel 130, to perform photoelectric conversion of the received light into a photoelectric charge having electric charge corresponding to its light intensity (in this case, photoelectron), and to accumulate the photoelectric charge. An anode electrode of the photodiode (PD) 131 is connected to a ground (GND) of the pixel region, and a cathode electrode thereof is connected to the floating diffusion (FD).

The reset transistor 132 is configured to reset an electric potential of the floating diffusion (FD). A drain electrode of the reset transistor 132 is connected to a power supply potential (VDD), and a source electrode thereof is connected to the floating diffusion (FD). Further, to a gate electrode of the reset transistor 132, a reset pulse (RST) is applied from the vertical scanning unit 122 (FIG. 1) via a reset line (not shown).

The amplifying transistor (AMP) 133 is configured to amplify change in potential of the floating diffusion (FD), and output the change as an electrical signal (analog signal). A gate electrode of the amplifying transistor 133 is connected to the floating diffusion (FD), a drain electrode thereof is connected to the power supply potential (VDD), and a source electrode thereof is connected to a drain electrode of the select transistor 134.

The select transistor 134 is configured to control the output of the electrical signal to a vertical signal line (VSL), which is supplied from the amplifying transistor 133. The drain electrode of the select transistor 134 is connected to the source electrode of the amplifying transistor 133, and a source electrode thereof is connected to the vertical signal line (VSL). Further, to a gate electrode of the select transistor 134, a selection pulse (SEL) is applied from the vertical scanning unit 122 (FIG. 1) via a selection line (not shown).

(Pixel Array)

In the pixel region 111, unit pixels 130 each configured as illustrated in FIG. 2 are arranged in a matrix pattern (array pattern) as in the example illustrated in FIG. 3.

(Pixel Structure)

Further, as illustrated in FIG. 4, the unit pixel 130 (photodiode 131) has what is called a vertical spectral structure that is capable of color separation in the vertical direction with respect to a substrate (depth direction). Note that, in the structure of the example of FIG. 4, the unit pixel 130 (photodiode 131) may perform color separation into green by using an organic photoelectric conversion film, and perform color separation into red and blue respectively in accordance with silicon depths. Alternatively, the unit pixel 130 (photodiode 131) may perform color separation into green, red, and blue respectively in accordance with the silicon depths.

(Full Depletion)

Further, as illustrated in FIG. 2, the photodiode 131 (its organic photoelectric conversion film) structured as described above is connected to the floating diffusion (FD) by wire bonding, and hence full depletion is not achieved. As a result, large kTC noise may be generated, and the kTC noise is difficult to sufficiently reduce by methods in related art.

(Readout)

Figure 5:
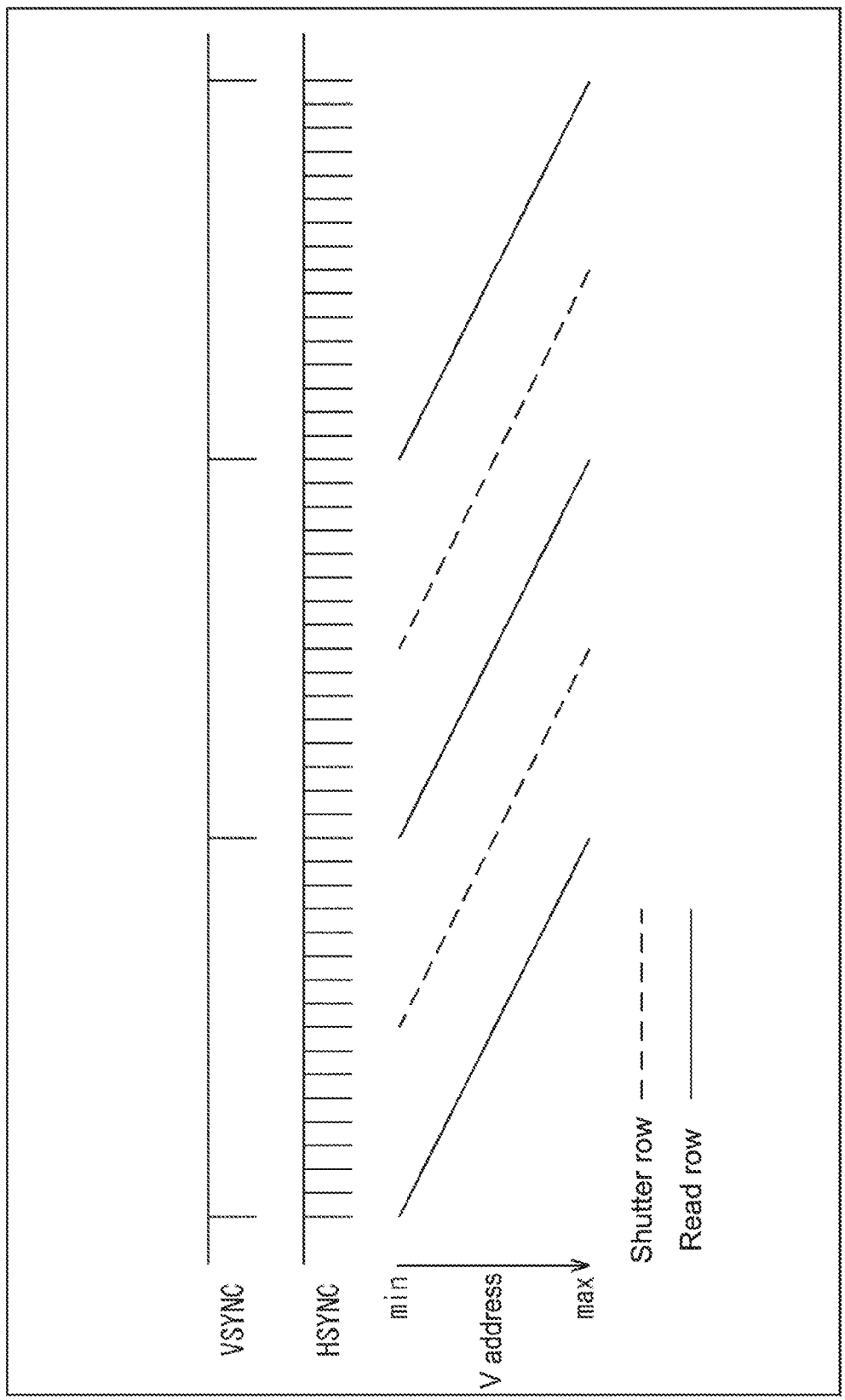
FIG. 5 is an explanatory timing chart showing an example of how pixel readout is performed.

FIG. 5 is an explanatory timing chart showing an example of how the signal is read out from the unit pixel 130 as described above.

As shown in FIG. 5, in the image pickup element 100, readout from the unit pixels is performed by a shutter operation and a read operation. The shutter operation refers to an operation of resetting the floating diffusion (FD), and the read operation refers to an operation of reading out, from the floating diffusion (FD), the electric charge that is obtained through the photoelectric conversion. As shown in FIG. 5, in each of the unit pixels 130, the shutter operation and the read operation are performed alternately to each other. In other words, a signal corresponding to electric charge that is obtained through the photoelectric conversion and accumulated after the floating diffusion is reset by the shutter operation is read out by the read operation.

(Readout Control Process)

In the image pickup element 100 in which the signals are read out by the procedure as described above from the unit pixels 130 configured as described above, the sensor control unit 121 executes a readout control process as follows so as to control the units. With this, the signals are read out from the unit pixels. With reference to the flowchart of FIG. 6, description is made of an example of a flow of the readout control process. In the description, FIG. 7 is also referred to as appropriate.

When the readout control process is started, in Step S101, the sensor control unit 121 controls the vertical scanning unit 122 so that the shutter operation is performed to set reset signals to H (High). In this state, the unit pixels 130 are controlled to perform an AZ (Auto Zero: matching a ramp wave and a reference of VSL) operation. In short, in Step S101, the vertical scanning unit 122 sets reset signals of unit pixels 130 in shutter rows that are subjected to the shutter operation to H. Further, under the state in which the reset signals have been set to H, the components of the unit pixels 130 in the shutter rows perform the AZ operation. In this way, signal readout is performed.

In Step S102, the sensor control unit 121 controls the A/D conversion unit 112 via the horizontal scanning unit 123 so that the signals read out from the unit pixels in each of the columns by the process of Step S101 are subjected to the A/D conversion. In short, in Step S102, the A/D conversion unit 112 performs the A/D conversion of the signals that are read out from the unit pixels in each of the columns.

Figure 7:
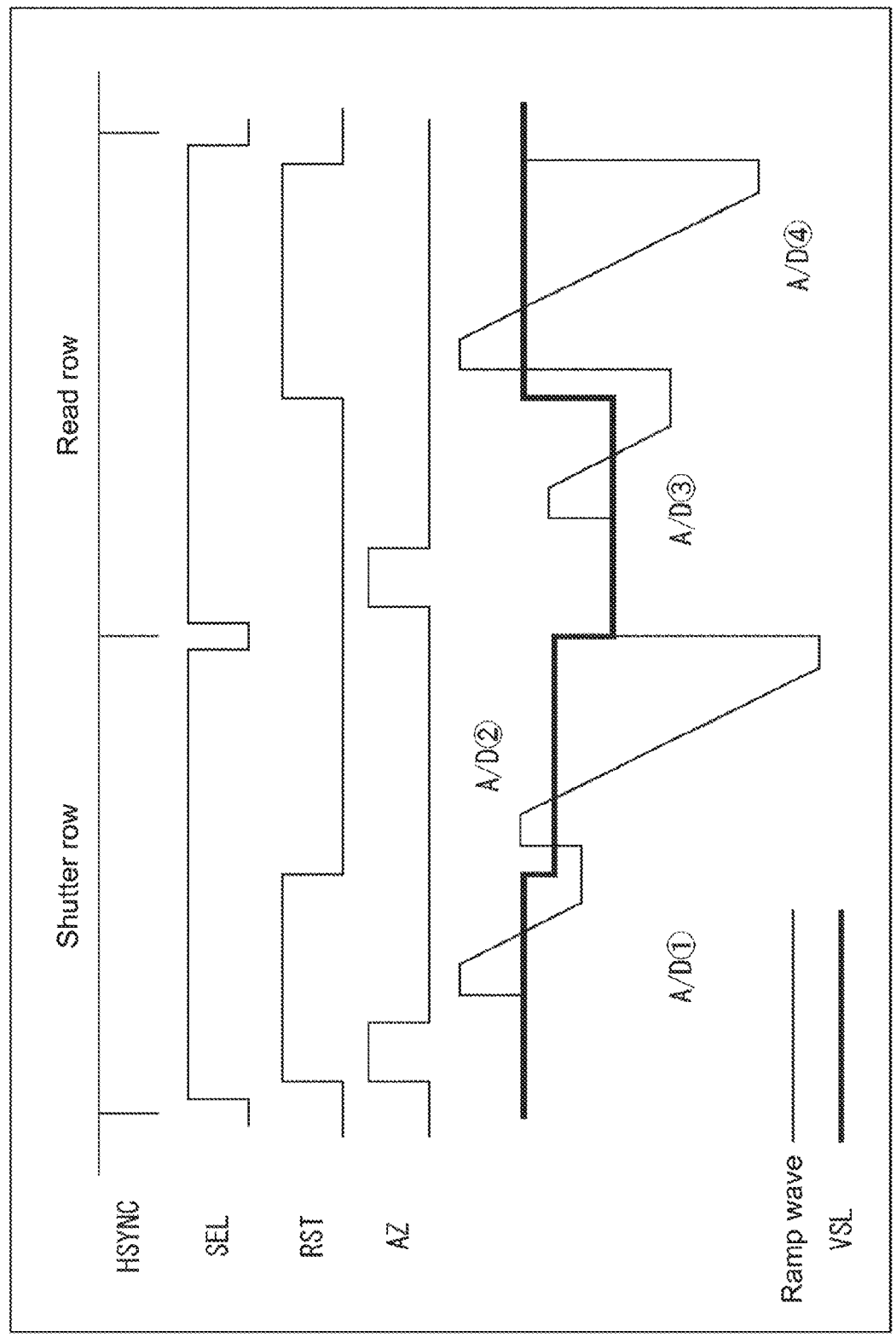
FIG. 7 is an explanatory timing chart showing an example of how pixels are driven at the time of the pixel readout.

In this way, an A/D conversion result corresponding to a part "A/D1" in FIG. 7 (numeral "1" is encircled in FIG. 7) is obtained.

In Step S103, the sensor control unit 121 controls the storage unit 114 via the CDS processing unit 113 so that digital data corresponding to the A/D conversion result obtained through the process of Step S102 is stored thereto. In short, in Step S103, the storage unit 114 stores supplied digital data (A/D conversion result obtained through the process of Step S102).

In Step S104, the sensor control unit 121 controls the vertical scanning unit 122 so that the shutter operation is performed to set the reset signals to L (Low). In this state, the unit pixels 130 are controlled to perform the signal readout. In short, in Step S104, the vertical scanning unit 122 switches the reset signals of the unit pixels 130 in the shutter rows to L. Further, the components of the unit pixels 130 in the shutter rows perform the signal readout under the state in which the reset signals have been set to L.

In Step S105, the sensor control unit 121 controls the A/D conversion unit 112 via the horizontal scanning unit 123 so that the signals read out from the unit pixels in each of the columns by the process of Step S104 are subjected to the A/D conversion. In short, in Step S105, the A/D conversion unit 112 performs the A/D conversion of the signals that are read out from the unit pixels in each of the columns.

In this way, another A/D conversion result corresponding to a part "A/D2" in FIG. 7 (numeral "2" is encircled in FIG. 7) is obtained.

In Step S106, the sensor control unit 121 controls the storage unit 114 via the CDS processing unit 113 so that digital data corresponding to the A/D conversion result obtained through the process of Step S105 is stored thereto. In short, in Step S106, the storage unit 114 stores supplied digital data (A/D conversion result obtained through the process of Step S105).

In Step S107, the sensor control unit 121 controls the CDS processing unit 113 so that the digital data items corresponding to the A/D conversion results that are stored to the storage unit 114 in Steps S103 and S106 are read out therefrom, and that the correlated double sampling (CDS) is performed on the shutter rows by using those data items. In short, in Step S107, the CDS processing unit 113 reads out the digital data items corresponding to the A/D conversion results that are stored to the storage unit 114 in Steps S103 and S106, and performs the correlated double sampling (CDS) on the shutter rows by using those data items. As a result of this process, still another A/D conversion result corresponding to kTC noise (first output signal) is obtained.

In Step S108, the sensor control unit 121 controls the storage unit 114 via the CDS processing unit 113 so that the CDS result that is obtained through the process of Step S107 (in other words, A/D conversion result corresponding to kTC noise (first output signal)) is stored thereto. In short, in Step S108, the storage unit 114 stores a supplied CDS result (A/D conversion result corresponding to kTC noise (first output signal), which is obtained through the process of Step S107).

Next, in Step S109, the sensor control unit 121 controls the vertical scanning unit 122 so that the read operation is performed to set the reset signals to L. In this state, the unit pixels 130 are controlled to perform the AZ operation. In short, in Step S109, the vertical scanning unit 122 sets reset signals of the unit pixels 130 in read rows that are subjected to the read operation to L. Further, the components of the unit pixels 130 in the read rows perform the AZ operation under the state in which the reset signals have been set to L. In this way, signal readout is performed.

In Step S110, the sensor control unit 121 controls the A/D conversion unit 112 via the horizontal scanning unit 123 so that the signals read out from the unit pixels in each of the columns by the process of Step S109 are subjected to the A/D conversion. In short, in Step S110, the A/D conversion unit 112 performs the A/D conversion of the signals that are read out from the unit pixels in each of the columns.

In this way, yet another A/D conversion result corresponding to a part "A/D3" in FIG. 7 (numeral "3" is encircled in FIG. 7) is obtained.

In Step S111, the sensor control unit 121 controls the storage unit 114 via the CDS processing unit 113 so that digital data corresponding to the A/D conversion result obtained through the process of Step S110 is stored thereto. In short, in Step S111, the storage unit 114 stores supplied digital data (A/D conversion result obtained through the process of Step S110).

In Step S112, the sensor control unit 121 controls the vertical scanning unit 122 so that the read operation is performed to set the reset signals to H. In this state, the unit pixels 130 are controlled to perform the signal readout. In short, in Step S112, the vertical scanning unit 122 switches the reset signals of the unit pixels 130 in the read rows to H. Further, the components of the unit pixels 130 in the read rows perform the signal readout under the state in which the reset signals have been set to H.

In Step S113, the sensor control unit 121 controls the A/D conversion unit 112 via the horizontal scanning unit 123 so that the signals read out from the unit pixels in each of the columns by the process of Step S112 are subjected to the A/D conversion. In short, in Step S113, the A/D conversion unit 112 performs the A/D conversion of the signals that are read out from the unit pixels in each of the columns.

In this way, yet another A/D conversion result corresponding to a part "A/D4" in FIG. 7 (numeral "4" is encircled in FIG. 7) is obtained.

In Step S114, the sensor control unit 121 controls the storage unit 114 via the CDS processing unit 113 so that digital data corresponding to the A/D conversion result obtained through the process of Step S113 is stored thereto. In short, in Step S114, the storage unit 114 stores supplied digital data (A/D conversion result obtained through the process of Step S113).

In Step S115, the sensor control unit 121 controls the CDS processing unit 113 so that the digital data items corresponding to the A/D conversion results that are stored to the storage unit 114 in Steps S111 and S114 are read out therefrom, and that the correlated double sampling (CDS) is performed on the read rows by using those data items. In short, in Step S115, the CDS processing unit 113 reads out the digital data items corresponding to the A/D conversion results that are stored to the storage unit 114 in Steps S111 and S114, and performs the correlated double sampling (CDS) on the read rows by using those data items. As a result of this process, yet another A/D conversion result corresponding to kTC noise and electric charge obtained through photoelectric conversion for a predetermined accumulation time period (second output signal) is obtained.

In Step S116, the sensor control unit 121 controls the storage unit 114 via the CDS processing unit 113 so that the correlated double sampling (CDS) is executed by reading out the CDS result that is stored to the storage unit 114 in Step S108 (in other words, A/D conversion result corresponding to kTC noise (first output signal), and then by using this CDS result and the CDS result that is obtained through the process of Step S115 (in other words, A/D conversion result corresponding to kTC noise and electric charge obtained through photoelectric conversion for a predetermined accumulation time period (second output signal)). In short, in Step S116, the CDS processing unit 113 reads out the first output signal from the storage unit 114, and performs the correlated double sampling (CDS) by using the first output signal and the second output signal. For example, the CDS processing unit 113 subtracts the first output signal from the second output signal. As a result of this process, yet another A/D conversion result corresponding to sufficiently suppressed kTC noise and to electric charge obtained through photoelectric conversion for a predetermined accumulation time period (third output signal)) is obtained.

In Step S117, the sensor control unit 121 controls the CDS processing unit 113 so that the third output signal obtained in Step S116 is supplied to the data output unit 115. Then, the third output signal is supplied to the outside of the image pickup element 100. In short, in Step S117, the data output unit 115 outputs the third output signal supplied from the CDS processing unit 113.

When the process of Step S117 is ended, the readout control process is ended.

By executing the processes as described above, the A/D conversion result corresponding to sufficiently suppressed kTC noise and to electric charge obtained through photoelectric conversion for a predetermined accumulation time period (third output signal) can be output as the captured image data from the image pickup element 100 (CDS processing unit 113) to the outside. In this way, the image pickup element 100 is capable of suppressing the captured images from being deteriorated in image quality by kTC noise and the like.

With regard to the configuration of the unit pixels, the array of the unit pixels, the pixel structure, and the like that are described hereinabove with reference, for example, to FIGS. 2 to 4, the present technology is applicable to signal processing apparatus configured to process signals to be read out from unit pixels having any structure or configuration, or arrayed in any pattern. In other words, the unit pixels to which the present technology is applicable are not particularly limited in configuration, structure, or array pattern. Therefore, the configuration, the array, the structure, and the like of the unit pixels to which the present technology is applicable are not limited to those in the example described above (examples of FIGS. 2 to 4).

Note that, as described above, as for the unit pixels in which full depletion is not achieved, in particular, the kTC noise is more difficult to sufficiently suppress. However, also in this case, when the present technology is applied, the kTC noise included in the pixel signals can be sufficiently suppressed. Thus, in this case, application of the present technology enables the image pickup element to suppress deterioration in image quality of images corresponding to image data. As a result, greater advantages can be obtained.

3. Third Embodiment

By the way, in the readout control process according to the second embodiment described above (FIGS. 6 and 7), the kTC noise is removed by performing the correlated double sampling (CDS) on voltage fluctuation caused by a feed through (FT). Thus, readout needs to be performed in consideration of the variation to be caused by the feed through at the time of the readout. Thus, the voltage becomes higher in reset phase (R-phase) than in a data phase (D-phase) correspondingly to the feed through. When A/D converters in related art are used, there may occur a phenomenon that a reference signal having a ramp waveform (ramp wave) does not match the signal (VSL) read out from the unit pixel 130, and the A/D conversion is not properly performed.

In order to avoid this phenomenon, A/D converters need to be prepared respectively for the colors of green, red, and blue. Alternatively, clamp circuits need to be mounted respectively for two systems of pixels using the organic photoelectric conversion films and the pixels using the photodiodes. Employment of such configurations causes an increase in a circuit scale and complication of control. In view of the circumstances, there have been demands for A/D converters capable of not only suppressing the increase in circuit scale and complication of control, but also avoiding influence of the voltage fluctuation caused by the feed through.

In order to satisfy such demands, although not described in detail hereinabove, in the readout control process according to the second embodiment (FIGS. 6 and 7), not only the increase in circuit scale and complication of control, but also the influence of the voltage fluctuation caused by the feed through are suppressed. With this, in the A/D conversion unit 112, the A/D conversion is properly performed through comparison between the signals to be read out from the unit pixel 130 via the vertical signal line (VSL) and the reference signal having the ramp waveform (ramp wave).

In this context, hereinbelow, as a third embodiment, description is made of the readout control process according to the second embodiment (FIGS. 6 and 7) in more detail.

(Image Pickup Element)

Figure 8:
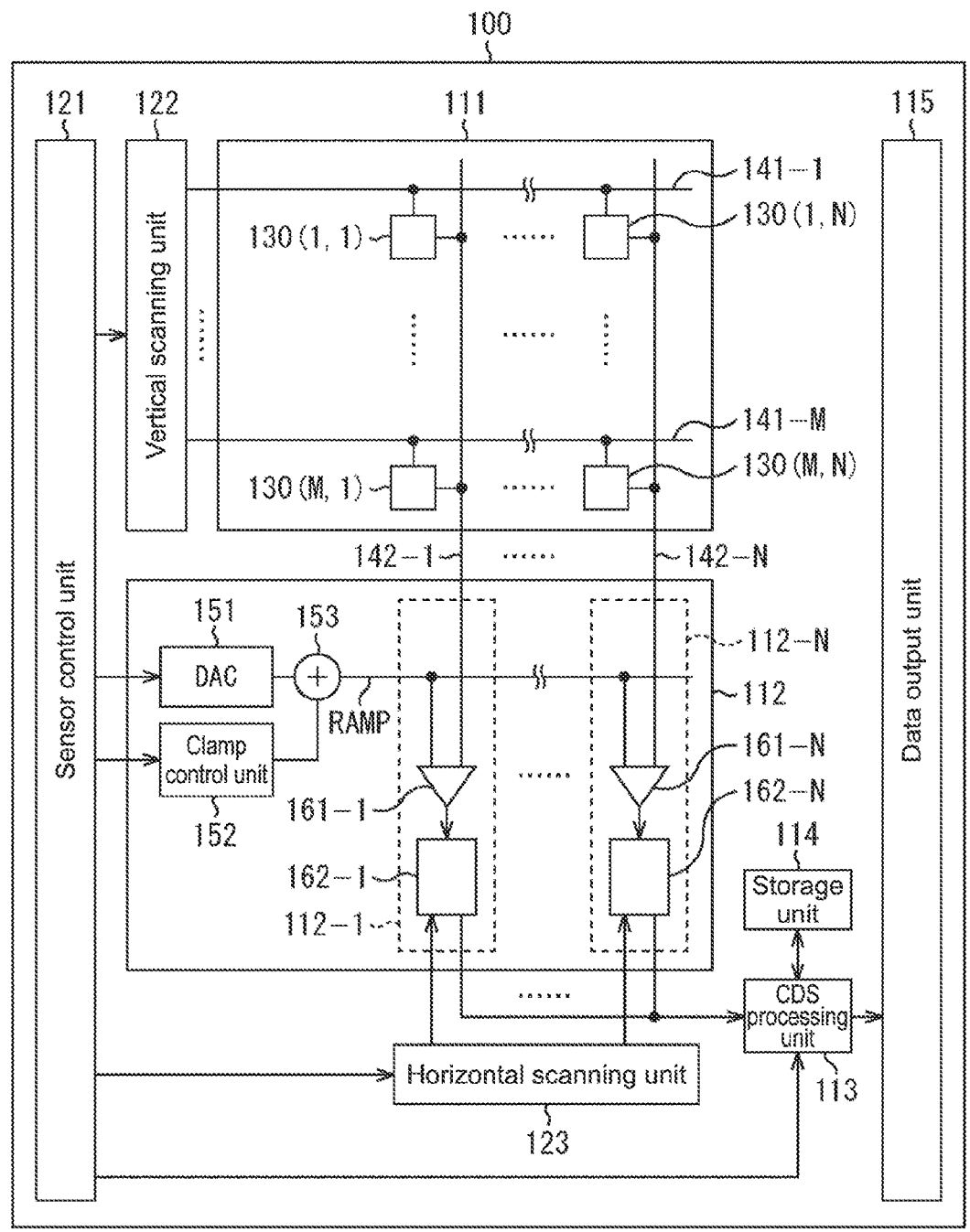
FIG. 8 is a diagram of another specific configuration example of the image pickup element.

FIG. 8 is a diagram of another main configuration example of the image pickup element to which the present technology is applied. The image pickup element 100 illustrated in FIG. 8 is, for example, a CMOS image sensor. Parts corresponding to those of the image pickup element 100 illustrated in FIG. 1 are denoted by the same reference symbols, and description thereof is omitted as appropriate. In other words, FIG. 8 illustrates, in more detail, configurations of the pixel region 111 and the A/D conversion unit 112 of the image pickup element 100.

In the pixel region 111, the unit pixels 130 (M, N) are arrange in a matrix pattern of M×N (M and N are each a natural number). In the pixel region 111, in the pixel array in the matrix pattern, row control lines 141-1 to 141-M are formed along an arrangement direction of pixels (left-and-right directions in FIG. 8) in respective pixel rows, and vertical signal lines (VSL) 142-1 to 142-N are formed along an arrangement direction of pixels (upper-and-lower directions in FIG. 8) in respective pixel columns.

The A/D conversion unit 112 performs the A/D conversion of the analog signals read out from the unit pixels 130 arrayed in the matrix pattern in the pixel region 111. The A/D conversion unit 112 includes the ADCs 112-1 to 112-N(N is an arbitrary natural number), a DAC (Digital/Analog Converter) 151 configured to generate the reference signal having the ramp waveform (ramp wave (RAMP)), a clamp control unit 152, and an adder 153.

The DAC 151 is configured to generate the ramp wave, and supply this ramp wave as an output signal to the adder 153 under control by the sensor control unit 121. The clamp control unit 152 is configured to generate an output signal for DC level control, and supply this signal to the adder 153 under control by the sensor control unit 121. The adder 153 is configured to add the output signal from the DAC 151 and the output signal from the clamp control unit 152, and to supply a sum thereof as the reference signal having the ramp waveform (ramp wave (RAMP)) to the ADCs 112-1 to 112-N.

In the ADC 112-1, a comparator 161-1 compares a voltage level of analog signals (pixel signals) read out via the VSL 142-1 from the unit pixels 130 in a first column and a voltage level of the reference signal from the adder 153 (ramp wave (RAMP)) to rise and fall with a predetermined slope) to each other. At this time, a counter latch operates in a counter 162-1. In the ADC 112-1, the reference signal from the adder 153 and counter values obtained by the counter 162-1 vary in one-to-one correspondence. With this, the analog signals (pixel signals) input via the VSL 142-1 are converted to digital data.

In other words, the ADC 112-1 converts variation in voltage level of the reference signal to variation in time. Specifically, the ADC 112-1 converts the variation in voltage level to digital values by counting the time in a predetermined cycle (clock). In this case, when the analog signals (pixel signals) input via the VSL 142-1 and the reference signal from the adder 153 intersect with each other, output from the comparator 161-1 is inverted. Then, an input clock to the counter 162-1 is stopped. With this, the A/D conversion is completed.

In the ADCs 112-2 to 112-N, as in the ADC 112-1, the comparator 161-2 to a comparator 161-N compare analog signals (pixel signals) input via a VSL 142-2 and the VSL 142-N and the reference signal from the adder 153 to each other. Then, counters 162-2 to 162-N each perform the counter latch operation. In this way, the A/D conversion is performed.

Note that, based on a clamp signal (CLPEN) from the sensor control unit 121, the clamp control unit 152 generates the output signal for DC level control, and supplies that signal to the adder 153. Specifically, the clamp control unit 152 generates the output signal for DC level control under the state in which the reset signals of the unit pixels 130 have been set to be high by the shutter operation and the state in which the reset signals of the unit pixels 130 have been set to be high by the read operation. Then, in the adder 153, the output signal from the DAC 151 and the output signal from the clamp control unit 152 are added to each other. In this way, the reference signal having the ramp waveform (ramp wave (RAMP)) is obtained.

The reference signal having the ramp waveform has an extended dynamic range in comparison with that in a case where clamping is not performed. Thus, under the state in which the reset signals have been set to be high, in other words, at a timing of the R-phase in which the voltage fluctuation caused by the feed through has influence, when control to clamp the reference signal is performed so that the dynamic range of the reference signal is extended, the analog signals (pixel signals) read out from the unit pixels 130 via the VSL 142 are suppressed from being deviated from the reference signal. With this, the A/D conversion can be properly performed.

Note that, the clamp control unit 152 includes a resister capable of setting adjustment values of an amount of the clamping (clamp codes). The sensor control unit 121 supplies the clamp signal (CLPEN) to the clamp control unit 152 so as to enable the resister to be set the adjustment values of the amount of the clamping independently at the timings corresponding to the shutter rows and the read rows and for each of the colors of green, red, and blue. The clamp control unit 152 is capable of clamping the reference signal by performing clamp control at each of the timings and for each of the colors based on the adjustment values of the amount of the clamping, which are set by the resister. As a result, the readout control process can be accurately executed without preparing A/D converters respectively for those colors or providing additional circuits such as clamp circuits for two systems.

(Readout Control Process)

In the image pickup element 100 configured as described above (FIG. 8), at the time of reading out the signals from the unit pixels 130, the sensor control unit 121 executes a readout control process as follows so as to control the units. With this, the signals are read out from the unit pixels 130. Next, with reference to the flowchart of FIG. 9, description is made of another example of the flow of the readout control process. In the description, FIG. 10 is also referred to as appropriate.

Figure 6:
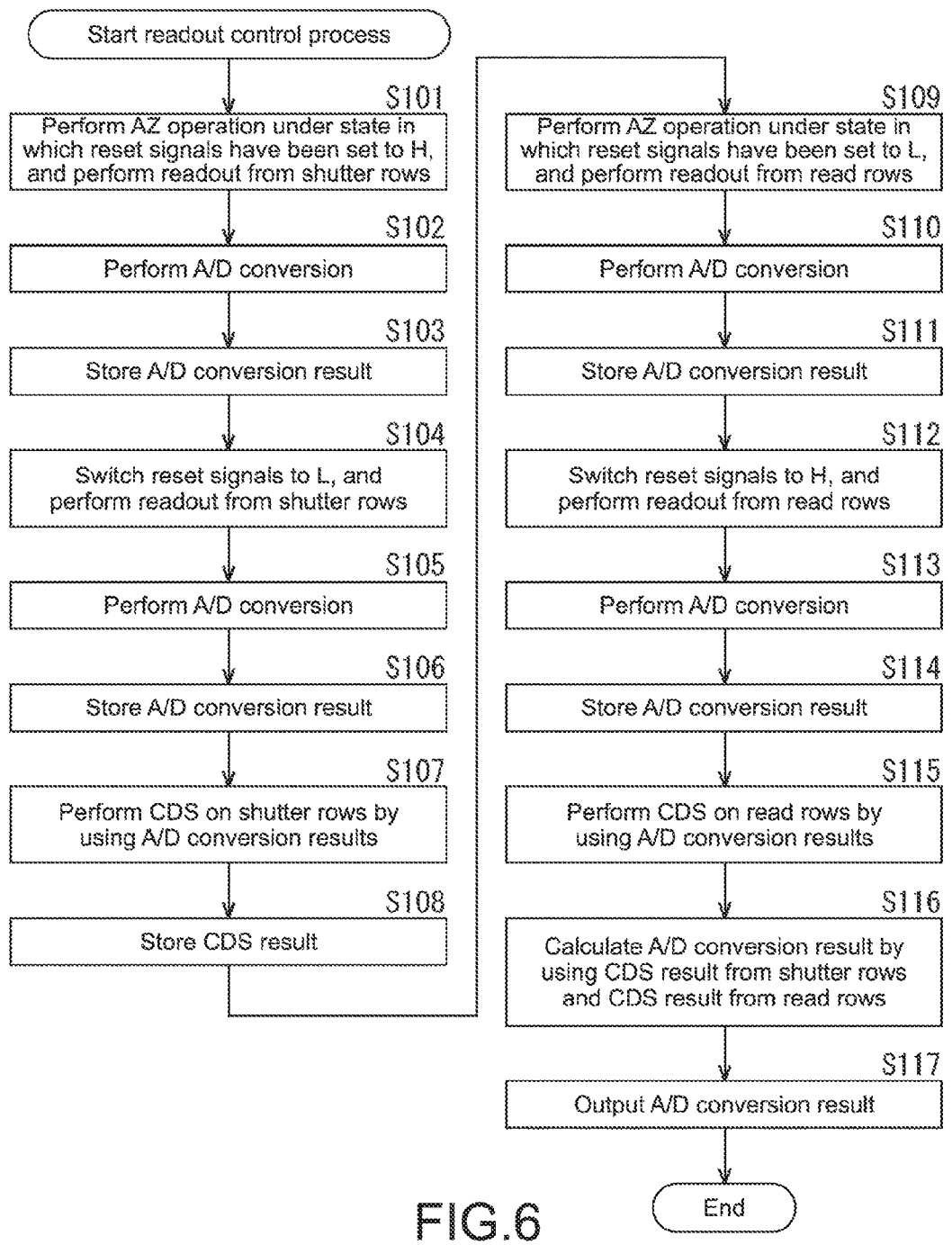
FIG. 6 is a flowchart showing an example of a flow of a readout control process.

When the readout control process is started, in Steps S201 to S204, as in Steps S101 to S103 in FIG. 6, the vertical scanning unit 122 is controlled to perform the shutter operation of setting the reset signals to H (High). Under the state in which the reset signals have been set to H, the components of the unit pixels 130 in the shutter rows perform the AZ operation. In this way, signal readout is performed. Then, the A/D conversion unit 112 performs the A/D conversion of the signals that are read out from the unit pixels 130 in each of the columns by the process of Step S201. This A/D conversion is performed under the state in which the reset signals have been set to be high, in other words, at the timing of the R-phase in which the voltage fluctuation caused by the feed through has influence. Thus, the clamp control unit 152 performs the clamp control (Step S202). With this, the output signal from the DAC 151 is clamped.

Figure 10:
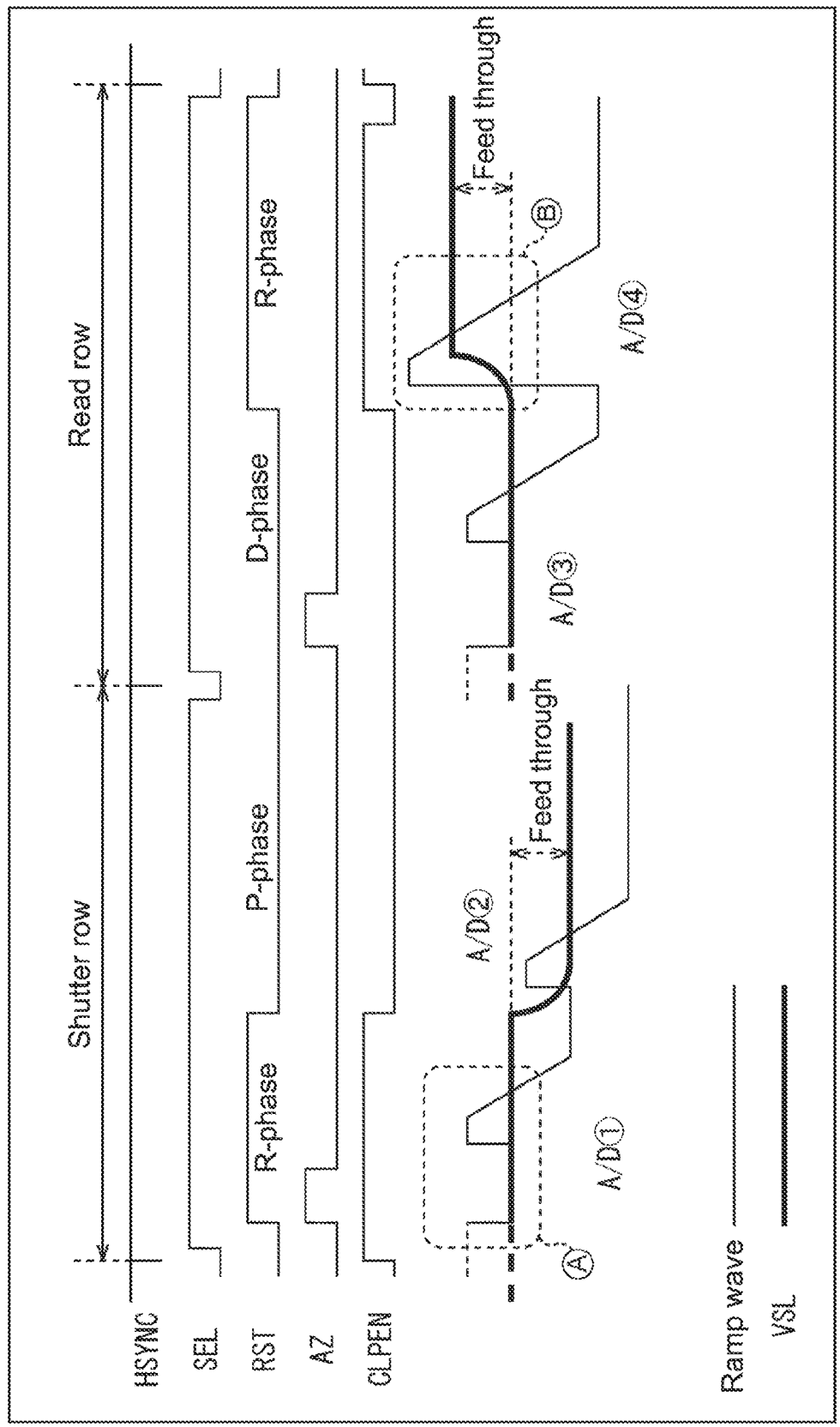
FIG. 10 is an explanatory timing chart showing another example of how pixels are driven at the time of the pixel readout.

As a result, as shown in the dotted-line circle A in FIG. 10 (symbol "A" is encircled in FIG. 10), the dynamic range of the reference signal from the adder 153 is extended. With this, the signals that are read out from the unit pixels 130 in each of the columns can be properly subjected to the A/D conversion without being deviated from the reference signal having the ramp waveform (Step S203). In this way, an A/D conversion result corresponding to a part "A/D1" in FIG. 10 (numeral "1" is encircled in FIG. 10) is obtained. Then, the storage unit 114 stores digital data corresponding to the A/D conversion result obtained through the process of Step S203 (Step S204).

In Steps S205 to S207, as in Steps S104 to S106 in FIG. 6, the vertical scanning unit 122 is controlled to perform the shutter operation of setting the reset signals to L (Low). Under the state in which the reset signals have been set to L, the components of the unit pixels 130 in the shutter rows perform the signal readout. Then, the A/D conversion unit 112 performs the A/D conversion of the signals that are read out from the unit pixels 130 in each of the columns by the process of Step S205.

In this way, another A/D conversion result corresponding to a part "A/D2" in FIG. 10 (numeral "2" is encircled in FIG. 10) is obtained. Then, the storage unit 114 stores digital data corresponding to the A/D conversion result obtained through the process of Step S206 (Step S207).

In Steps S208 and S209, as in Steps S107 and S108 in FIG. 6, the CDS processing unit 113 reads out the digital data items corresponding to the A/D conversion results that are stored to the storage unit 114 in Steps S204 and S207, and performs the correlated double sampling (CDS) on the shutter rows by using those data items. As a result of this process, still another A/D conversion result corresponding to kTC noise and a feed through voltage (first output signal) is obtained. Then, the storage unit 114 stores the CDS result obtained through the process of Step S208 (Step S209).

Next, in Steps S210 to S212, as in Steps S109 to S111 in FIG. 6, the vertical scanning unit 122 is controlled to perform the read operation of setting the reset signals to L. Under the state in which the reset signals have been set to L, the components of the unit pixels 130 in the read rows perform the AZ operation. In this way, the signal readout is performed. Then, the A/D conversion unit 112 performs the A/D conversion of the signals that are read out from the unit pixels 130 in each of the columns by the process of Step S210.

In this way, yet another A/D conversion result corresponding to a part "A/D3" in FIG. 10 (numeral "3" is encircled in FIG. 10) is obtained. Then, the storage unit 114 stores digital data corresponding to the A/D conversion result obtained through the process of Step S211 (Step S212).

In Steps S213 to S216, as in Steps S112 to S114 in FIG. 6, the vertical scanning unit 122 is controlled to perform the read operation of setting the reset signals to H. Under the state in which the reset signals have been set to H, the components of the unit pixels 130 in the read rows perform signal readout. Then, the A/D conversion unit 112 performs the A/D conversion of the signals that are read out from the unit pixels 130 in each of the columns by the process of Step S213. This A/D conversion is performed under the state in which the reset signals have been set to be high, in other words, at the timing of the R-phase in which the voltage fluctuation caused by the feed through has influence. Thus, the clamp control unit 152 performs the clamp control (Step S214). With this, the output signal from the DAC 151 is clamped.

As a result, as shown in the dotted-line circle B in FIG. 10 (symbol "B" is encircled in FIG. 10), the dynamic range of the reference signal from the adder 153 is extended. With this, the signals that are read out from the unit pixels 130 in each of the columns can be properly subjected to the A/D conversion without being deviated from the reference signal having the ramp waveform (Step S215). In this way, yet another A/D conversion result corresponding to a part "A/D4" in FIG. 10 (numeral "4" is encircled in FIG. 10) is obtained. Then, the storage unit 114 stores digital data corresponding to the A/D conversion result obtained through the process of Step S215 (Step S216).

In Step S217, as in Step S115 in FIG. 6, the CDS processing unit 113 reads out the digital data items corresponding to the A/D conversion results that are stored to the storage unit 114 in Steps S212 and S216, and performs the correlated double sampling (CDS) on the read rows by using those data items. As a result of this process, yet another A/D conversion result corresponding to kTC noise, a feed through voltage, and electric charge obtained through photoelectric conversion for a predetermined accumulation time period (second output signal) is obtained.

In Steps S218 and S219, as in Steps S116 and S117 in FIG. 6, the CDS processing unit 113 executes the correlated double sampling (CDS) by reading out, from the storage unit 114, the CDS result that is stored to the storage unit 114 in Step S209 (in other words, A/D conversion result corresponding to kTC noise and a feed through voltage (first output signal)), and then by using this CDS result and the CDS result that is obtained through the process of Step S217

(in other words, A/D conversion result corresponding to kTC noise, a feed through voltage, and electric charge obtained through photoelectric conversion for a predetermined accumulation time period (second output signal)).

For example, the CDS processing unit 113 subtracts the first output signal from the second output signal. As a result of this process, yet another A/D conversion result corresponding to sufficiently suppressed kTC noise and to electric charge obtained through photoelectric conversion for a predetermined accumulation time period (third output signal)) is obtained. The third output signal obtained in Step S218 is supplied to the data output unit 115, and output to the outside of the image pickup element 100 (Step S219).

Figure 9:
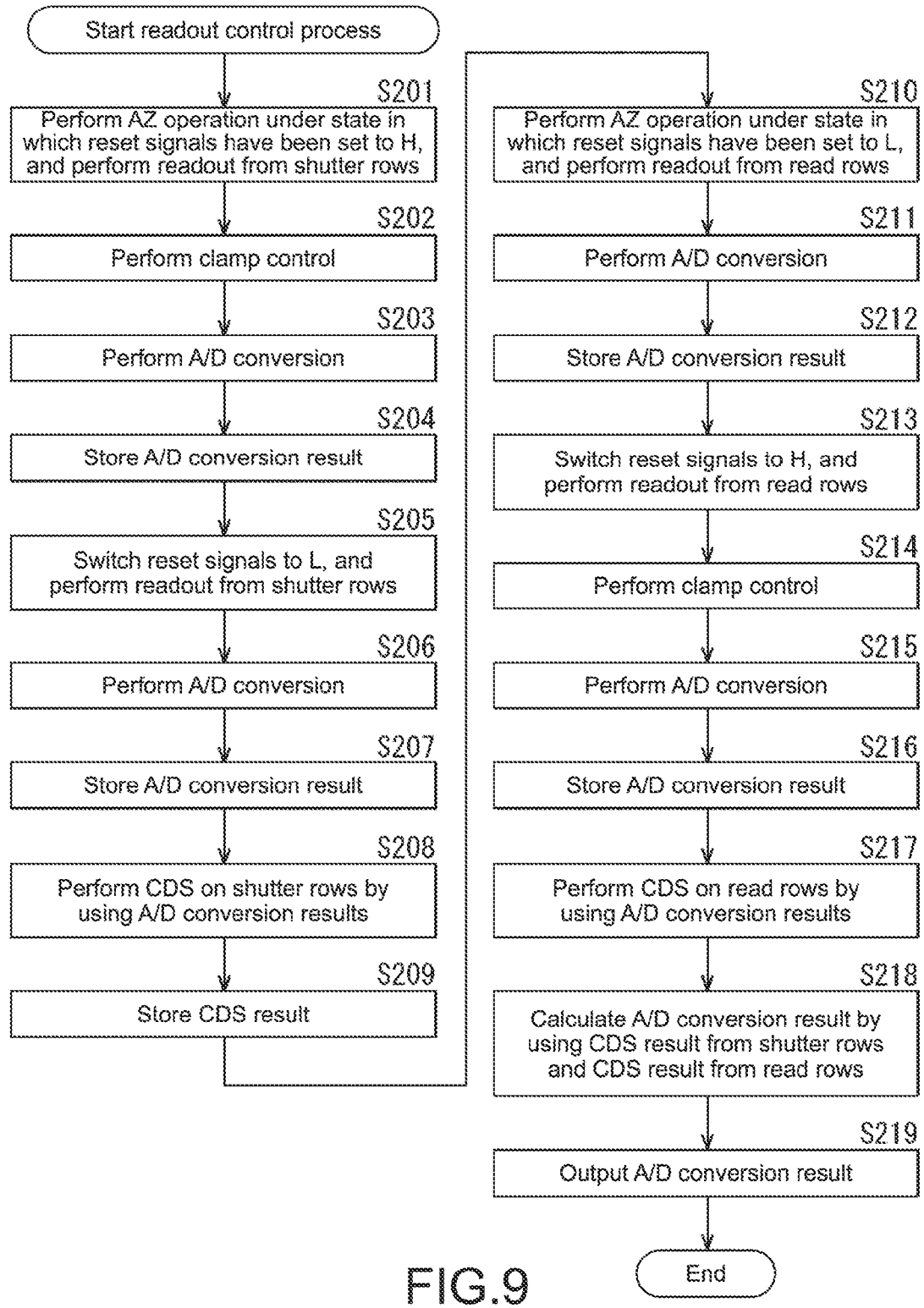
FIG. 9 is a flowchart showing another example of the flow of the readout control process.

When the process of Step S219 is ended, the readout control process of FIG. 9 is ended.

By executing the processes as described above, the A/D conversion result corresponding to sufficiently suppressed kTC noise and to electric charge obtained through photoelectric conversion for a predetermined accumulation time period (third output signal) can be output as the captured image data from the image pickup element 100 (CDS processing unit 113) to the outside. In this way, the image pickup element 100 is capable of suppressing the captured images from being deteriorated in image quality by kTC noise and the like.

Further, under the state in which the reset signals of the unit pixels 130 have been set to be high by the shutter operation, and the state in which the reset signals of the unit pixels 130 have been set to be high by the read operation, in other words, at the timing of the R-phase in which the voltage fluctuation caused by the feed through has influence, the control to clamp the reference signal having the ramp waveform (ramp wave (RAMP)) is performed so that the dynamic range of the reference signal is extended (amplitude is increased). With this, the analog signals (pixel signals) read out from the unit pixel 130 via the VSL 142 are suppressed from being deviated from the reference signal. In this way, the A/D conversion can be properly performed.

Note that, the readout control process according to the third embodiment (FIGS. 9 and 10) is an example of a readout control process on green pixels in a case where the color separation into green other than red and blue is performed by using the organic photoelectric conversion film in the unit pixel 130 having the vertical spectral structure.

Note that, as described above, the clamp control unit 152 includes the resister capable of setting the adjustment values of the amount of the clamping independently at the timings corresponding to the shutter rows and the read rows (for example, timings of "A/D1" and "A/D3" in FIG. 10) and for each of the colors of green, red, and blue (for example, green in FIG. 10). Thus, the clamp control unit 152 is capable of clamping the reference signal by performing clamp control at arbitrary timings and for each of the colors based on the adjustment values of the amount of the clamping, which are set by the resister.

As a result, without, for example, mounting clamp circuits correspondingly to A/D converters that are prepared respectively for the colors of green, red, and blue, the clamp control can be performed at an arbitrary timings and for each of the colors. Further, without, for example, mounting clamping circuits respectively for two systems of the pixels using the organic photoelectric conversion films and the pixels using the photodiodes, the clamp control can be performed for pixels having different characteristics.

In this way, when the clamp control unit 152 includes the resister capable of setting the adjustment values of the amount of the clamping, it is no longer necessary to mount clamp circuits correspondingly to A/D converters that are prepared respectively for the colors, or to mount clamping circuits respectively for the two systems of the pixels using the organic photoelectric conversion films and the pixels using the photodiodes. Thus, the increase in circuit scale can be suppressed, and the complication of control can be avoided.

4. Fourth Embodiment

Image Pickup Element

Note that, the image pickup element to which the present technology is applied may include a plurality of semiconductor substrates to be superimposed on each other.

Figure 11:
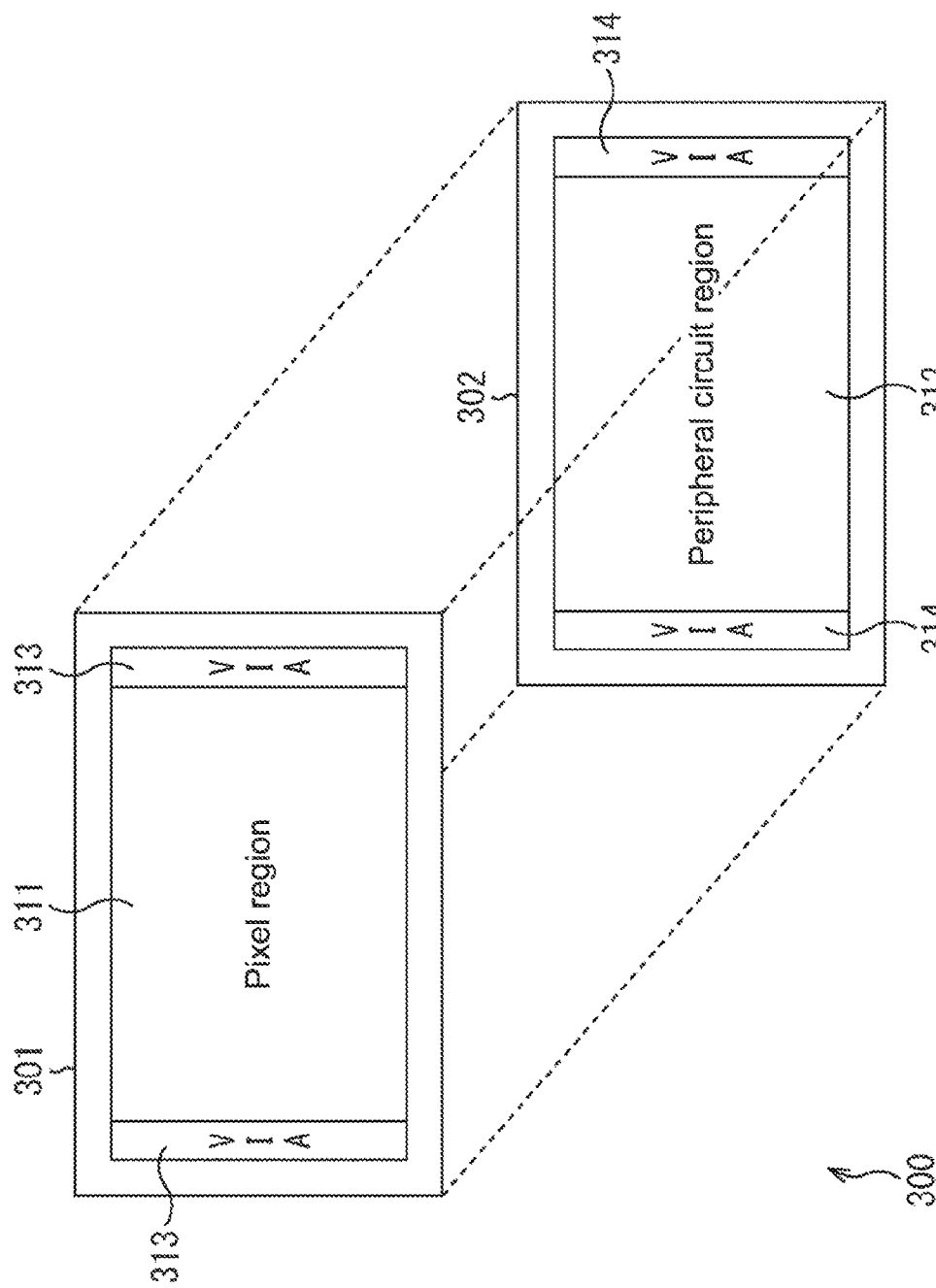
FIG. 11 is a diagram of a main configuration example of a part of a CMOS image sensor.

FIG. 11 is a diagram of a main configuration example of the image pickup element to which the present technology is applied. An image pickup element 300 illustrated in FIG. 11 is an element configured to image photographic subjects, and obtain digital data of captured images as well as the image pickup element 100. As illustrated in FIG. 11, the image pickup element 300 includes two semiconductor substrates (stacked chips (pixel chip 301 and circuit chip 302) to be superimposed on each other. Note that, the number of the semiconductor substrates (stacked chips) (number of layers) is not particularly limited as long as a plurality of the semiconductor substrates (stacked chips) are provided. For example, three or more layers may be employed.

In a pixel region 311 formed on the pixel chip 301, there are arrayed a plurality of unit pixels each including a photoelectric conversion element configured to perform photoelectric conversion of incident light. Further, in a peripheral circuit region 312 formed on the circuit chip 302, there is formed a peripheral circuit configured to process pixel signals read out from the pixel region 311.

A circuit configuration of the image pickup element 300 is the same as that of the image pickup element 100 (FIGS. 1 and 8). In other words, the pixel region 311 is a region similar to the pixel region 111, and the plurality of unit pixels 130 (FIG. 2) are formed as in the pixel region 111. Further, in the peripheral circuit region 312, the A/D conversion unit 112, the CDS processing unit 113, the storage unit 114, the data output unit 115, the sensor control unit 121, the vertical scanning unit 122, the horizontal scanning unit 123, and other units are formed as the peripheral circuit.

As described above, the pixel chip 301 and the circuit chip 302 are superimposed on each other, and form a multi-layer structure (laminated structure). The pixels in the pixel region 311 formed on the pixel chip 301 and the peripheral circuit in the peripheral circuit region 312 formed on the circuit chip 302 are electrically connected to each other through intermediation of, for example, via regions (VIA) 313 and through-vias (VIA) formed in the via regions (VIA) 314.

As in this image pickup element 300, the peripheral circuit including the A/D conversion unit 112 and the CDS processing unit 113 to which the present technology is applied needs not necessarily be formed on the same chip on which the pixel region 311 (pixel region 111) is formed. In other words, those components may be provided in any configuration as long as a configuration substantially the same as the configuration of the image pickup element 100 described with reference to FIG. 1 can be secured. Specifically, all the components of the image pickup element 100 need not necessarily be provided integrally with each other. More specifically, some or all of the components of the peripheral circuit, such as the A/D conversion unit 112 and the CDS processing unit 113, need not necessarily be formed in the same LSI in which the pixel region 111 (unit pixels 130 therein) is formed. Alternatively, the peripheral circuit may be formed separately into a plurality of LSIs.

5. Fifth Embodiment

Imaging Apparatus

Figure 12:
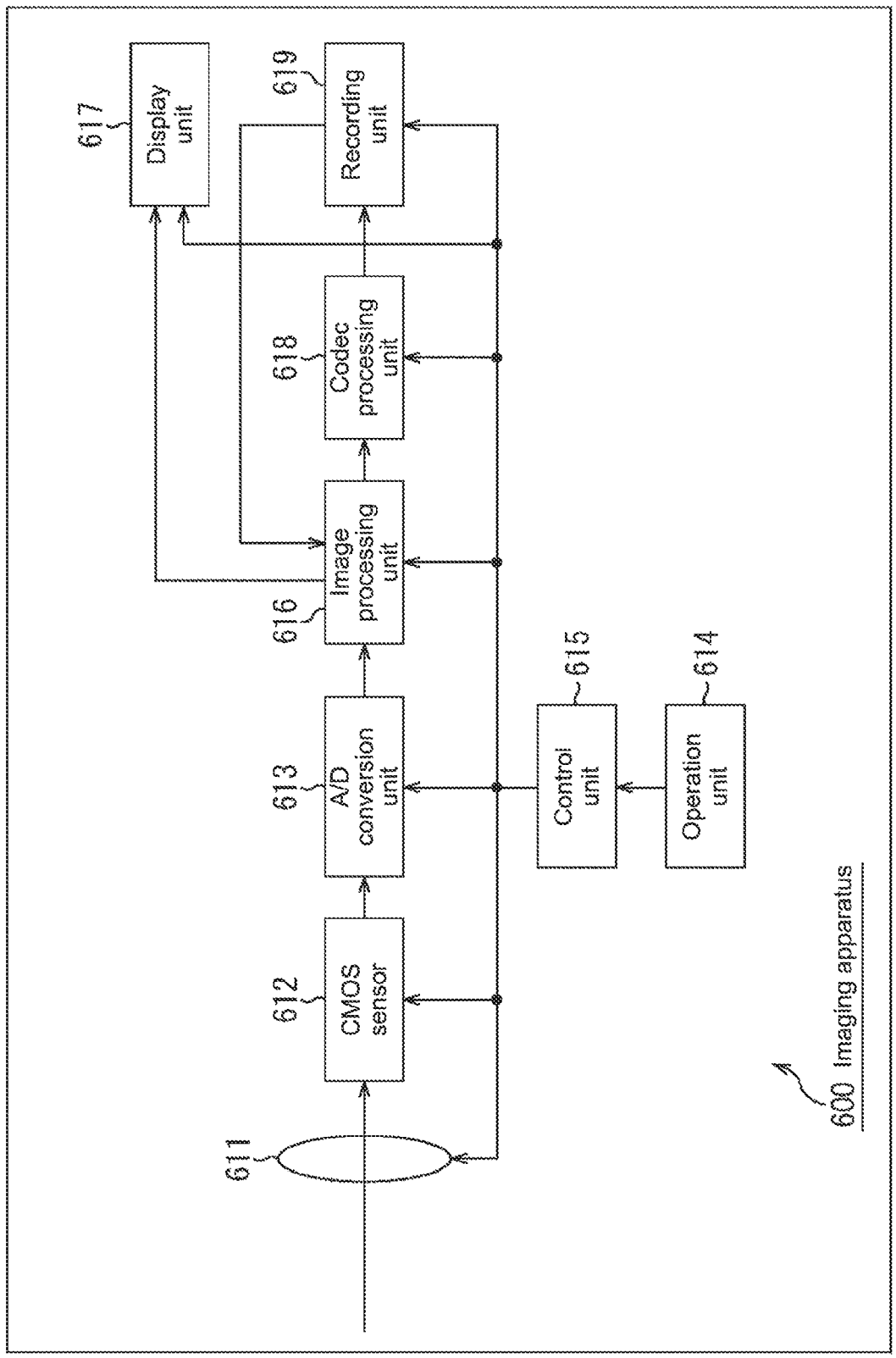
FIG. 12 is a diagram of a main configuration example of an imaging apparatus.

Note that, the present technology is applicable not only to the image pickup element. For example, the present technology is applicable also to apparatus (electronic apparatus) including the image pickup element, such as an imaging apparatus. FIG. 12 is a block diagram of a main configuration example of the imaging apparatus as an example of the electronic apparatus to which the present technology is applied. An imaging apparatus 600 illustrated in FIG. 12 is an apparatus configured to image photographic subjects, and output captured images of the photographic subjects as electrical signals.

As illustrated in FIG. 12, the imaging apparatus 600 includes an optical unit 611, a CMOS sensor 612, an operation unit 614, a control unit 615, an image processing unit 616, a display unit 617, a codec processing unit 618, and a recording unit 619.

The optical unit 611 includes a lens configured to adjust a focal point with respect to a photographic subject and condense light from a focal position, an aperture configured to adjust exposure, and a shutter configured to control an image capturing timing. The optical unit 611 is configured to transmit light (incident light) therethrough from the photographic subject to the CMOS sensor 612.

The CMOS sensor 612 is configured to perform photoelectric conversion of the incident light into a signal of each of the pixels (pixel signals), execute signal processes such as the CDS, and supply captured image data obtained through the process to the image processing unit 616.

Examples of the operation unit 614 include a jog dial (trademark), keys, buttons, and a touch panel. The operation unit 614 is configured to accept input by a user, and transmit signals corresponding to the operation input to the control unit 615.

The control unit 615 is configured to drive and control, in response to the signals corresponding to the operation input via the operation unit 614 by the user, the optical unit 611, the CMOS sensor 612, the image processing unit 616, the display unit 617, the codec processing unit 618, and the recording unit 619 so as to cause those units to execute imaging processes.

The image processing unit 616 is configured to execute image processes on the captured image data obtained by the CMOS sensor 612. More specifically, the image processing unit 616 executes various image processes such as color mixture correction, black level correction, white balance adjustment, a matrix process, gamma correction, YC conversion on the captured image data supplied from the CMOS sensor 612. The image processing unit 616 is configured also to supply the captured image data subjected to the image processes to the display unit 617 and the codec processing unit 618.

Examples of the display unit 617 include a liquid crystal display. The display unit 617 is configured to display images of the photographic subject based on the captured image data supplied from the image processing unit 616.

The codec processing unit 618 is configured to execute an encoding process according to a predetermined method on the captured image data supplied from the image processing unit 616, and supply encoded data obtained through the encoding process to the recording unit 619.

The recording unit 619 is configured to record the encoded data from the codec processing unit 618. The encoded data recorded in the recording unit 619 is read and decoded as appropriate by the image processing unit 616. Captured image data obtained through the decoding process is supplied to the display unit 617, and captured images corresponding to the captured image data are displayed.

The present technology described hereinabove is applied to the CMOS sensor 612 of the imaging apparatus 600 as described above. In other words, the image pickup elements according to the embodiments described above are used as the CMOS sensor 612. With this, the CMOS sensor 612 is capable of suppressing deterioration in image quality. As a result, images of the photographic subject can be captured in high quality with the imaging apparatus 600.

Note that, the configuration of the imaging apparatus to which the present technology is applied is not limited to those described hereinabove, and other configurations may be employed. For example, the imaging apparatus is applicable not only to digital still cameras and digital camcorders, but also to information processing apparatus having an imaging function, such as a mobile phone, a smartphone, a tablet device, and a personal computer. Further, the imaging apparatus is applicable also to a camera module to be used while being mounted to other information processing apparatus (or to be incorporated therein as a built-in device).

Further, the configuration described as a single apparatus (or processing unit) hereinabove may be divided into a plurality of apparatus (or processing units). In contrast, the configurations described as a plurality of apparatus (or processing units) hereinabove may be integrated into a single apparatus (or processing unit). Still further, as a matter of course, configurations other than those described hereinabove may be added to the configurations of the apparatus (or processing units). Yet further, as long as the configurations and operations of the entire system are substantially unchanged, a part of a configuration of a certain apparatus (or processing unit) may be incorporated in a configuration of another apparatus (or another processing unit).

The technical scope of the present disclosure, which is described in detail hereinabove in the preferred embodiments of the present disclosure with reference to the accompanying drawings, is not limited to those examples. It is obvious that various changes and modifications could have been made by those who have common knowledge in the technical field of the present disclosure within the scope of the technical idea described in "What is claimed is." It should be understood that those changes and modifications obviously belong to the technical scope of the present disclosure.

Note that, the present technology may employ the following configurations.

(1) A signal processing apparatus, including:
an A/D conversion unit configured to perform
A/D conversion of a first signal that is read out from unit pixels under a state in which reset signals of the unit pixels have been set to be high by a shutter operation of resetting floating diffusions of the unit pixels, the unit pixels being configured to perform photoelectric conversion of incident light under a state in which full depletion is prevented, A/D conversion of a second signal that is read out from the unit pixels under a state in which the reset signals of the unit pixels have been set to be low by the shutter operation, A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion, and A/D conversion of a fourth signal that is read out from the unit pixels under a state in which the reset signals of the unit pixels have been set to be high by the read operation; and a correlated double sampling processing unit configured to generate
- a first output signal by performing correlated double sampling using
  - a first digital data item obtained through the A/D conversion of the first signal by the A/D conversion unit, and
  - a second digital data item obtained through the A/D conversion of the second signal by the A/D conversion unit,
- a second output signal by performing correlated double sampling using
  - a third digital data item obtained through the A/D conversion of the third signal by the A/D conversion unit, and
  - a fourth digital data item obtained through the A/D conversion of the fourth signal by the A/D conversion unit, and
- a third output signal by performing correlated double sampling using
  - the first output signal, and
  - the second output signal.

(2) The signal processing apparatus according to Item (1), further including a storage unit configured to store the first digital data item, the second digital data item, the third digital data item, and the fourth digital data item that are obtained by the A/D conversion unit, in which the correlated double sampling processing unit is configured to perform correlated double sampling by using one of a pair of the first digital data item and the second digital data item that are read out from the storage unit and a pair of the third digital data item and the fourth digital data item that are read out from the storage unit.

(3) The signal processing apparatus according to Item (1) or (2), in which the storage unit is configured to further store the first output signal that is generated by the correlated double sampling processing unit, and the correlated double sampling processing unit is configured to perform correlated double sampling by using the second output signal that is generated by the correlated double sampling processing unit and the first output signal that is read out from the storage unit.

(4) The signal processing apparatus according to any one of Items (1) to (3), further including a clamp control unit configured to clamp a reference signal having a ramp waveform such that, in the A/D conversion unit, the A/D conversion of the first signal that is read out from the unit pixels under the state in which the reset signals of the unit pixels have been set to be high by the shutter operation is properly performed through comparison between the first signal and the reference signal having the ramp waveform, and that the A/D conversion of the fourth signal that is read out from the unit pixels under the state in which the reset signals of the unit pixels have been set to be high by the read operation is properly performed through comparison between the fourth signal and the reference signal having the ramp waveform.

(5) A signal processing method, including:

performing A/D conversion of a first signal that is read out from unit pixels under a state in which reset signals of the unit pixels have been set to be high by a shutter operation of resetting floating diffusions of the unit pixels, the unit pixels being configured to perform photoelectric conversion of incident light under a state in which full depletion is prevented;

performing A/D conversion of a second signal that is read out from the unit pixels under a state in which the reset signals of the unit pixels have been set to be low by the shutter operation;

generating a first output signal by performing correlated double sampling using
- a first digital data item obtained through the A/D conversion of the first signal, and
- a second digital data item obtained through the A/D conversion of the second signal;

performing A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion;

performing A/D conversion of a fourth signal that is read out from the unit pixels under a state in which the reset signals of the unit pixels have been set to be high by the read operation;

generating a second output signal by performing correlated double sampling using
- a third digital data item obtained through the A/D conversion of the third signal, and
- a fourth digital data item obtained through the A/D conversion of the fourth signal; and generating a third output signal by performing correlated double sampling using
- the first output signal, and
- the second output signal.

(6) An image pickup element, including:

unit pixels configured to perform photoelectric conversion of incident light under a state in which full depletion is prevented;

an A/D conversion unit configured to perform
- A/D conversion of a first signal that is read out from the unit pixels under a state in which reset signals of the unit pixels have been set to be high by a shutter operation of resetting floating diffusions of the unit pixels,
- A/D conversion of a second signal that is read out from the unit pixels under a state in which the reset signals of the unit pixels have been set to be low by the shutter operation,
- A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion, and A/D conversion of a fourth signal that is read out from the unit pixels under a state in which the reset signals of the unit pixels have been set to be high by the read operation; and a correlated double sampling processing unit configured to generate a first output signal by performing correlated double sampling using a first digital data item obtained through the A/D conversion of the first signal by the A/D conversion unit, and a second digital data item obtained through the A/D conversion of the second signal by the A/D conversion unit, a second output signal by performing correlated double sampling using a third digital data item obtained through the A/D conversion of the third signal by the A/D conversion unit, and a fourth digital data item obtained through the A/D conversion of the fourth signal by the A/D conversion unit, and a third output signal by performing correlated double sampling using the first output signal, and the second output signal.

(7) The image pickup element according to any one of Items (6) and (8) to (10), in which the unit pixels each include a photoelectric conversion unit that performs the photoelectric conversion of the incident light and is connected to corresponding one of the floating diffusions by wire bonding.

(8) The image pickup element according to any one of Items (6), (7), (9), and (10), in which the unit pixels each include a pixel structure that performs color separation in a vertical direction with respect to a substrate.

(9) The image pickup element according to any one of Items (6) to (8) and (10), in which the unit pixels each perform color separation into green by using an organic photoelectric conversion film, and color separation into red and blue respectively in accordance with silicon depths.

(10) The image pickup element according to any one of Items (6) to (9), in which the unit pixels each perform color separation into green, red, and blue respectively in accordance with silicon depths.

(11) An imaging apparatus, including:

an imaging unit configured to image a photographic subject; and an image processing unit configured to execute image processes on captured image data obtained by the imaging unit, the imaging unit including unit pixels configured to perform photoelectric conversion of incident light under a state in which full depletion is prevented, an A/D conversion unit configured to perform A/D conversion of a first signal that is read out from the unit pixels under a state in which reset signals of the unit pixels have been set to be high by a shutter operation of resetting floating diffusions of the unit pixels, A/D conversion of a second signal that is read out from the unit pixels under a state in which the reset signals of the unit pixels have been set to be low by the shutter operation, A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion, and A/D conversion of a fourth signal that is read out from the unit pixels under a state in which the reset signals of the unit pixels have been set to be high by the read operation, and a correlated double sampling processing unit configured to generate a first output signal by performing correlated double sampling using a first digital data item obtained through the A/D conversion of the first signal by the A/D conversion unit, and a second digital data item obtained through the A/D conversion of the second signal by the A/D conversion unit, a second output signal by performing correlated double sampling using a third digital data item obtained through the A/D conversion of the third signal by the A/D conversion unit, and a fourth digital data item obtained through the A/D conversion of the fourth signal by the A/D conversion unit, and a third output signal by performing correlated double sampling using the first output signal, and the second output signal.

What is claimed is:

1. A signal processing apparatus, comprising:

an A/D conversion unit configured to perform

A/D conversion of a first signal that is read out from unit pixels under a state in which reset signals of the unit pixels have been set to be high by a shutter operation of resetting floating diffusions of the unit pixels, the unit pixels being configured to perform photoelectric conversion of incident light under a state in which full depletion is prevented, A/D conversion of a second signal that is read out from the unit pixels under a state in which the reset signals of the unit pixels have been set to be low by the shutter operation, A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion, and A/D conversion of a fourth signal that is read out from the unit pixels under a state in which the reset signals of the unit pixels have been set to be high by the read operation; and a correlated double sampling processing unit configured to generate a first output signal by performing correlated double sampling using a first digital data item obtained through the A/D conversion of the first signal by the A/D conversion unit, and a second digital data item obtained through the A/D conversion of the second signal by the A/D conversion unit, a second output signal by performing correlated double sampling using
a third digital data item obtained through the A/D conversion of the third signal by the A/D conversion unit, and
a fourth digital data item obtained through the A/D conversion of the fourth signal by the A/D conversion unit, and a third output signal by performing correlated double sampling using
the first output signal, and
the second output signal.

2. The signal processing apparatus according to claim 1, further comprising a storage unit configured to store the first digital data item, the second digital data item, the third digital data item, and the fourth digital data item that are obtained by the A/D conversion unit,
wherein the correlated double sampling processing unit is configured to perform correlated double sampling by using one of a pair of the first digital data item and the second digital data item that are read out from the storage unit and a pair of the third digital data item and the fourth digital data item that are read out from the storage unit.

3. The signal processing apparatus according to claim 2, wherein
the storage unit is configured to further store the first output signal that is generated by the correlated double sampling processing unit, and
the correlated double sampling processing unit is configured to perform correlated double sampling by using the second output signal that is generated by the correlated double sampling processing unit and the first output signal that is read out from the storage unit.

4. The signal processing apparatus according to claim 1, further comprising a clamp control unit configured to clamp a reference signal having a ramp waveform such that, in the A/D conversion unit,
the A/D conversion of the first signal that is read out from the unit pixels under the state in which the reset signals of the unit pixels have been set to be high by the shutter operation is properly performed through comparison between the first signal and the reference signal having the ramp waveform, and that
the A/D conversion of the fourth signal that is read out from the unit pixels under the state in which the reset signals of the unit pixels have been set to be high by the read operation is properly performed through comparison between the fourth signal and the reference signal having the ramp waveform.

5. An image pickup element, comprising:
unit pixels configured to perform photoelectric conversion of incident light under a state in which full depletion is prevented;
an A/D conversion unit configured to perform
A/D conversion of a first signal that is read out from the unit pixels under a state in which reset signals of the unit pixels have been set to be high by a shutter operation of resetting floating diffusions of the unit pixels,
A/D conversion of a second signal that is read out from the unit pixels under a state in which the reset signals of the unit pixels have been set to be low by the shutter operation,
A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion, and
A/D conversion of a fourth signal that is read out from the unit pixels under a state in which the reset signals of the unit pixels have been set to be high by the read operation; and
a correlated double sampling processing unit configured to generate
a first output signal by performing correlated double sampling using
a first digital data item obtained through the A/D conversion of the first signal by the A/D conversion unit, and
a second digital data item obtained through the A/D conversion of the second signal by the A/D conversion unit,
a second output signal by performing correlated double sampling using
a third digital data item obtained through the A/D conversion of the third signal by the A/D conversion unit, and
a fourth digital data item obtained through the A/D conversion of the fourth signal by the A/D conversion unit, and
a third output signal by performing correlated double sampling using
the first output signal, and
the second output signal.

6. The image pickup element according to claim 5, wherein
the unit pixels each include a photoelectric conversion unit that performs the photoelectric conversion of the incident light and is connected to corresponding one of the floating diffusions by wire bonding.

7. The image pickup element according to claim 5, wherein
the unit pixels each include a pixel structure that performs color separation in a vertical direction with respect to a substrate.

8. The image pickup element according to claim 7, wherein
the unit pixels each perform
color separation into green by using an organic photoelectric conversion film, and
color separation into red and blue respectively in accordance with silicon depths.

9. The image pickup element according to claim 7, wherein
the unit pixels each perform color separation into green, red, and blue respectively in accordance with silicon depths.

10. An imaging apparatus, comprising:
an imaging unit configured to image a photographic subject; and
an image processing unit configured to execute image processes on captured image data obtained by the imaging unit, the imaging unit including
unit pixels configured to perform photoelectric conversion of incident light under a state in which full depletion is prevented,
an A/D conversion unit configured to perform A/D conversion of a first signal that is read out from the unit pixels under a state in which reset signals of the unit pixels have been set to be high by a shutter operation of resetting floating diffusions of the unit pixels, A/D conversion of a second signal that is read out from the unit pixels under a state in which the reset signals of the unit pixels have been set to be low by the shutter operation, A/D conversion of a third signal that is read out from the unit pixels under a state in which the reset signals of the unit pixels have been set to be low by a read operation of reading out electric charge from the floating diffusions of the unit pixels, the electric charge being obtained through the photoelectric conversion, and A/D conversion of a fourth signal that is read out from the unit pixels under a state in which the reset signals of the unit pixels have been set to be high by the read operation, and a correlated double sampling processing unit configured to generate a first output signal by performing correlated double sampling using
- a first digital data item obtained through the A/D conversion of the first signal by the A/D conversion unit, and
- a second digital data item obtained through the A/D conversion of the second signal by the A/D conversion unit, a second output signal by performing correlated double sampling using
- a third digital data item obtained through the A/D conversion of the third signal by the A/D conversion unit, and
- a fourth digital data item obtained through the A/D conversion of the fourth signal by the A/D conversion unit, and a third output signal by performing correlated double sampling using
- the first output signal, and
- the second output signal.

* * * * *